(12) United States Patent
Xiong et al.

(10) Patent No.: US 12,733,315 B2
(45) Date of Patent: Sep. 8, 2026

(54) DISPLAY PANEL AND DISPLAY DEVICE

(71) Applicant: Wuhan Tianma Microelectronics Co., Ltd., Wuhan (CN)

(72) Inventors: Xin Xiong, Wuhan (CN); Yongzhi Wang, Wuhan (CN); Kang Yang, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 426 days.

(21) Appl. No.: 18/243,707

(22) Filed: Sep. 8, 2023

(65) Prior Publication Data

US 2023/0420621 A1 Dec. 28, 2023

(30) Foreign Application Priority Data

Mar. 23, 2023 (CN) ......................... 202310303980.1

(51) Int. Cl.
*H10H 20/855* (2025.01)
*H10W 90/00* (2026.01)

(52) U.S. Cl.
CPC .......... *H10H 20/855* (2025.01); *H10W 90/00* (2026.01)

(58) Field of Classification Search
CPC .......................... H10H 20/855; H01L 25/0753
See application file for complete search history.

(56) References Cited

FOREIGN PATENT DOCUMENTS

| | | | |
|---|---|---|---|
| CN | 1612185 | A | 5/2005 |
| CN | 112002734 | A | 11/2020 |
| CN | 113745298 | A | 12/2021 |
| CN | 113782695 | A | 12/2021 |
| CN | 114335072 | A | 4/2022 |
| CN | 114497421 | A | 5/2022 |

OTHER PUBLICATIONS

English machine translation of CN 114335072 (Year: 2022).*

* cited by examiner

*Primary Examiner* — Anne M Hines
(74) *Attorney, Agent, or Firm* — KDW FIRM PLLC

(57) ABSTRACT

Provided are a display panel and a display device. The display panel includes a flat display region and a curved display region. The display panel further includes: an optical function layer on a side of the multiple light-emitting elements facing away from the base substrate; where at least part of the optical function layer is disposed in the flat display region; brightness of the display panel in a unit area of the flat display region at a viewing angle of 0° is first brightness, and brightness of the display panel in a unit area of the curved display region at a viewing angle of 0° is second brightness; and at the same height distance from the display surface of the display panel, the first brightness of at least part of the display panel is greater than the second brightness.

20 Claims, 17 Drawing Sheets

10

Light extraction side

10

Light extraction side 40 42 41 401 30 24 23 22 21 20 25 411/41 50 11 12

10
Light extraction side
40
42
41
30
d1
4121
d2
4122
24
23
20
22
21
25
51/50
52/50
11
12

DISPLAY PANEL AND DISPLAY DEVICE

CROSS-REFERENCE TO RELATED APPLICATION

This application claims priority to Chinese patent application No. 202310303980.1 filed with the CNIPA on Mar. 23, 2023, the disclosure of which is incorporated herein by reference in its entirety.

TECHNICAL FIELD

The present disclosure relates to the field of display technology and, in particular, to a display panel and a display device.

BACKGROUND

Organic light-emitting diodes (OLEDs) have the characteristics of self-luminescence, a fast response speed, a wide viewing angle, and the like and are widely applied to the display fields of mobile phones, tablets, televisions, and the like.

With the development of product differentiation, the design of curved screens has been adopted in many products. However, due to the design of a curved surface on the edge, the projection area of a pixel on the edge is smaller than the projection area of a pixel in a central region. Thus, both the brightness and the color accuracy of the edge of an OLED display panel are inferior to those of the central region, causing poor visual perception.

SUMMARY

The present disclosure provides a display panel and a display device to solve the problems of insufficient brightness and a color cast of a curved surface on the edge of a display panel.

According to an aspect of the present disclosure, a display panel is provided. The display panel includes a flat display region and a curved display region.

The display panel further includes a display function layer and an optical function layer.

The display function layer includes a base substrate and multiple light-emitting elements on a side of the base substrate.

The optical function layer is disposed on a side of the multiple light-emitting elements facing away from the base substrate; where at least part of the optical function layer is disposed in the flat display region.

Brightness of the display panel in a unit area of the flat display region at a viewing angle of 0° is first brightness; and brightness of the display panel in a unit area of the curved display region at a viewing angle of 0° is second brightness; where the viewing angle of 0° is a viewing angle perpendicular to a display surface of the display panel.

At the same height distance from the display surface of the display panel, the first brightness of at least part of the display panel is greater than the second brightness.

According to another aspect of the present disclosure, a display device is provided. The display device includes the preceding display panel.

According to the technical solutions of the present disclosure, the optical function layer is disposed on the side of the light-emitting elements facing away from the base substrate, which can change a path of light emitted by a light-emitting element, improve a light extraction rate of the display panel, and facilitate low power consumption of the display panel. At least part of the optical function layer is disposed in the flat display region, which can increase brightness of the display panel in the flat display region at a viewing angle of 0° and reduce brightness of the display panel in the flat display region at a large viewing angle, so that the brightness of the display panel in a unit area of the flat display region on a light extraction side can be increased and optical crosstalk between adjacent subpixels can be reduced. The second brightness is less than the first brightness so that brightness of the display panel in the curved display region at a large viewing angle can be increased, and the display panel in the curved display region emits more light to the light extraction side of the display panel, thereby increasing the brightness of the display panel in a unit area of the curved display region on the light extraction side and alleviating the problem of a darker color in the curved display region. At the same height distance from the display surface of the display panel, the second brightness of the display panel in a unit area of the curved display region may be different, so as to make subpixels of different colors in the display panel in the curved display region have uniform brightness at a large viewing angle, so that subpixels of various colors in the curved display region tend to have consistent brightness on the light extraction side of the display panel, alleviating the problem of a color cast due to the fact that light-emitting elements of different colors decay differently in brightness as the viewing angle increases.

It is to be understood that the content described in this part is neither intended to identify key or critical features of embodiments of the present disclosure nor intended to limit the scope of the present disclosure. Other features of the present disclosure become easily understood through the description hereinafter.

BRIEF DESCRIPTION OF DRAWINGS

To illustrate technical solutions in embodiments of the present disclosure more clearly, the drawings used in the description of the embodiments are briefly described below. Apparently, the drawings described below illustrate some embodiments of the present disclosure, and those of ordinary skill in the art may obtain other drawings based on these drawings on the premise that no creative work is done.

DETAILED DESCRIPTION

Technical solutions in embodiments of the present disclosure are described clearly and completely in conjunction with drawings in the embodiments of the present disclosure from which the solutions of the present disclosure are better understood by those skilled in the art. Apparently, the embodiments described below are part, not all, of the embodiments of the present disclosure. Based on the embodiments of the present disclosure, all other embodiments obtained by those of ordinary skill in the art on the premise that no creative work is done are within the scope of the present disclosure.

It is to be noted that terms such as "first" and "second" in the description, claims, and drawings of the present disclosure are used for distinguishing between similar objects and are not necessarily used for describing a particular order or sequence. It is to be understood that the data used in this manner are interchangeable in appropriate cases so that embodiments of the present disclosure described herein may be implemented in an order not illustrated or described herein. Additionally, the terms "including", "having", and variations thereof are intended to encompass a non-exclusive inclusion. For example, a process, method, system, product, or device that includes a series of steps or units not only includes the expressly listed steps or units but may also include other steps or units that are not expressly listed or are inherent to such process, method, product, or device.

Figure 1:
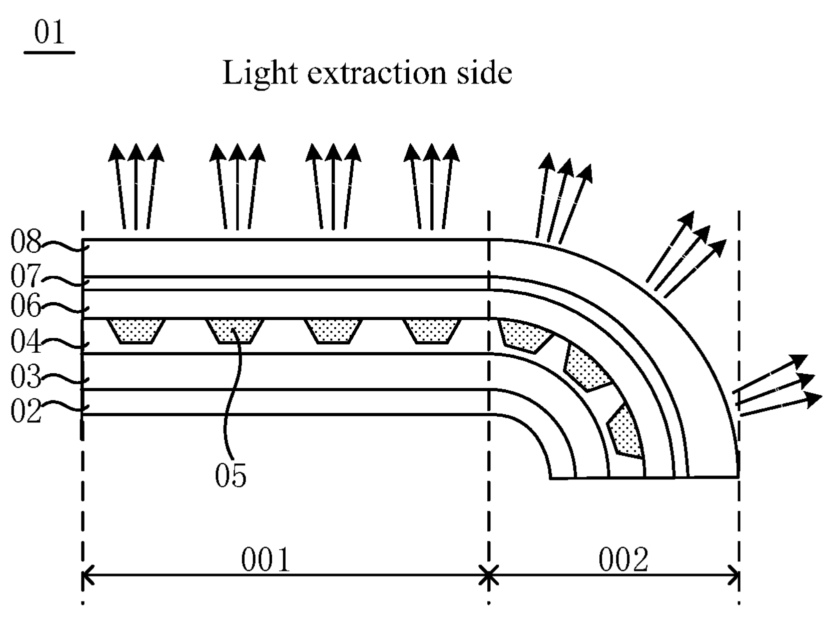
FIG. 1 is a structure diagram of a display panel in the related art.

FIG. 1 is a structure diagram of a display panel in the related art. Referring to FIG. 1, a display panel 01 includes a flat display region 001 and a curved display region 002, and the display panel 01 further includes a base substrate 02, a circuit layer 03, a light-emitting layer 04, a thin film encapsulation layer 06, a touch control layer 07, and an optical function layer 08 that are stacked in sequence, where the light-emitting layer 04 includes multiple light-emitting elements 05. Light emitted from the light-emitting elements 05 passes through the thin film encapsulation layer 06 and the touch control layer 07. Due to a difference between refractive indexes of different films and reflection on the films, the light-emitting elements 05 have relatively low light extraction efficiency, affecting power consumption and a service life of the display panel 01. Therefore, in the related art, the optical function layer 08 is disposed on a side of the touch control layer 07 facing away from the light-emitting layer 04 to change a light path, improve the light extraction efficiency of the light-emitting elements 05, and reduce the power consumption of the display panel.

The optical function layer 08 in the related art generally increases energy of light at a small viewing angle and decreases energy of light at a large viewing angle by use of a film structure with a different refractive index, so as to increase a light extraction rate of the light-emitting elements 05. However, light emitted by the display panel 01 in the curved display region 002 to a light extraction side is reduced, causing a darker color of the display panel 01 in the curved display region 002; and as the viewing angle increases, light-emitting elements 05 of different colors decay differently in brightness, and thus light emitted by the light-emitting elements 05 of different colors to the light extraction side has different energy, causing a color cast of the display panel 01 in the curved display region 002.

To solve the above technical problems, embodiments of the present disclosure provide a display panel including a flat display region and a curved display region; and the display panel further includes a display function layer and an optical function layer, where the display function layer includes a base substrate and multiple light-emitting elements on a side of the base substrate; the optical function layer is disposed on a side of the multiple light-emitting elements facing away from the base substrate; at least part of the optical function layer is disposed in the flat display region; brightness of the display panel in a unit area of the flat display region at a viewing angle of 0° is first brightness, and brightness of the display panel in a unit area of the curved display region at a viewing angle of 0° is second brightness, where the viewing angle of 0° is a viewing angle perpendicular to a display surface of the display panel; and at the same height distance from the display surface of the display panel, the first brightness of at least part of the display panel is greater than the second brightness.

With the above technical solutions, the optical function layer is disposed on the side of the light-emitting elements facing away from the base substrate, which can change a path of light emitted by a light-emitting element, improve a light extraction rate of the display panel, and facilitate low power consumption of the display panel. At least part of the optical function layer is disposed in the flat display region, which can increase brightness of the display panel in the flat display region at a viewing angle of 0° and reduce brightness of the display panel in the flat display region at a large viewing angle, so that brightness of the display panel in a unit area of the flat display region on a light extraction side can be increased and optical crosstalk between adjacent subpixels can be reduced. The second brightness is less than the first brightness so that brightness of the display panel in the curved display region at a large viewing angle can be increased, and the display panel in the curved display region emits more light to the light extraction side of the display panel, thereby increasing brightness of the display panel in a unit area of the curved display region on the light extraction side and alleviating the problem of a darker color in the curved display region. At the same height distance from the display surface of the display panel, the second brightness of the display panel in a unit area of the curved display region may be different, so as to make subpixels of different colors in the display panel in the curved display region have uniform brightness at a large viewing angle, so that subpixels of various colors in the curved display region tend to have consistent brightness on the light extraction side of the display panel, alleviating the problem of a color cast due to the fact that light-emitting elements of different colors decay differently in brightness as the viewing angle increases.

The preceding is a core idea of the present disclosure. Based on embodiments of the present disclosure, all other embodiments obtained by those of ordinary skill in the art on the premise that no creative work is done are within the scope of the present disclosure. Technical solutions in embodiments of the present disclosure are described clearly and completely hereinafter in conjunction with the drawings in embodiments of the present disclosure.

Figure 2:
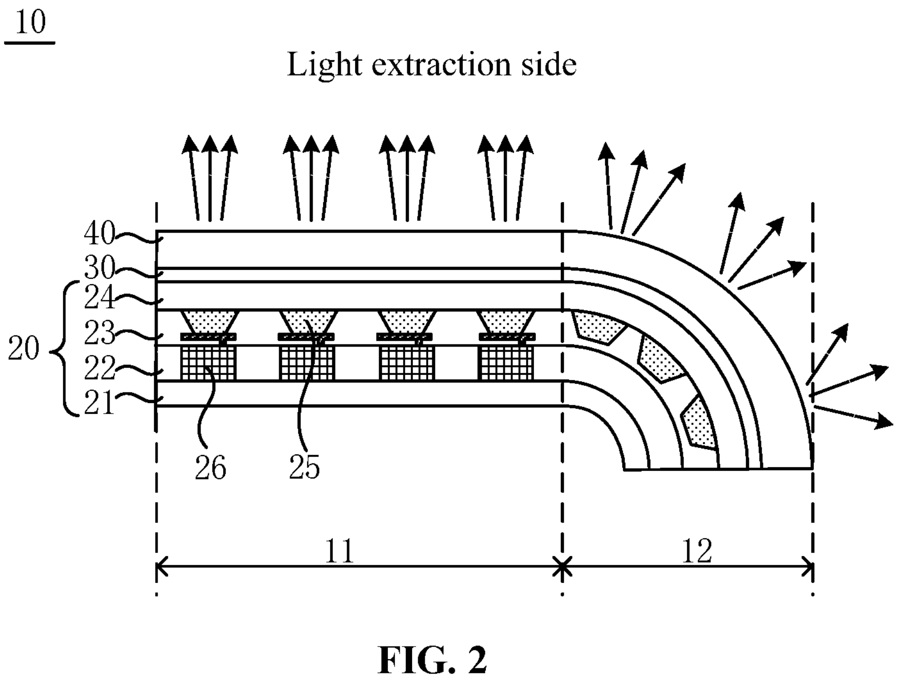
FIG. 2 is a structure diagram of a display panel according to an embodiment of the present disclosure.

FIG. 2 is a structure diagram of a display panel according to an embodiment of the present disclosure. Referring to FIG. 2, a display panel 10 includes a flat display region 11 and a curved display region 12; and the display panel 10 further includes a display function layer 20 and an optical function layer 40, where the display function layer 20 includes a base substrate 21 and multiple light-emitting elements 25 on a side of the base substrate 21; the optical function layer 40 is disposed on a side of the multiple light-emitting elements 25 facing away from the base substrate 21; and at least part of the optical function layer 40 is disposed in the flat display region 11. Brightness of the display panel 10 in a unit area of the flat display region 11 at a viewing angle of 0° is first brightness, and brightness of the display panel 10 in a unit area of the curved display region 12 at a viewing angle of 0° is second brightness, where the viewing angle of 0° is a viewing angle perpendicular to a display surface of the display panel 10; and at the same height distance from the display surface of the display panel 10, the first brightness of at least part of the display panel 10 is greater than the second brightness.

The unit area may be, for example, a circle with a radius of 0.1 mm, a square with a side length of 0.1 mm, or a circle, a polygon, or the like of another size. The display panel 10 in the unit area includes light-emitting elements 25 of different colors. The display surface is an outer surface of the display panel 10 facing away from the base substrate 21. The display surface is generally a smooth surface and includes a plane surface and a curved surface. A display surface side refers to a side of the display surface of the display panel 10 facing away from the base substrate 21. The display surface side includes different orientations, and the orientation of the display surface side varies with the curvature of the display surface. The light extraction side refers to a direction perpendicular to the display surface in the flat display region 11. The first brightness and the second brightness may be brightness detected in a unit area when a perpendicular distance between a light receiving surface of a brightness detection instrument and the display surface of the display panel 10 is K mm, where K is equal to 2, 4, 6, or another value.

For example, the display panel 10 includes multiple subpixels of different colors, where each subpixel includes a light-emitting element 25 and a pixel driving circuit 26. The display function layer 20 may include a circuit layer 22 and a light-emitting layer 23, the circuit layer 22 is disposed between the light-emitting layer 23 and the base substrate 21, the light-emitting layer 23 includes the multiple light-emitting elements 25, the circuit layer 22 includes multiple pixel driving circuits 26, the light-emitting element 25 is electrically connected to the pixel driving circuit 26, and the pixel driving circuit 26 is used for providing a pixel driving signal for the light-emitting element 25. The display function layer 20 further includes a thin film encapsulation layer 24 on a side of the light-emitting layer 23 facing away from the base substrate 21. The thin film encapsulation layer 24 is used for protecting the multiple light-emitting elements 25 in the light-emitting layer 23 from being easily oxidized and etched and prolonging a service life of the light-emitting element 25. The display panel 10 further includes a touch control layer 30 between the optical function layer 40 and the display function layer 20, where the touch control layer 30 enables the display panel 10 to implement a touch control function.

Based on the preceding embodiment, the display surface of the display panel 10 in the flat display region 11 is different from the display surface of the display panel 10 in the curved display region 12 so that light of the display panel 10 in the flat display region 11 at a viewing angle of 0° is emitted to the light extraction side of the display panel 10, and light of the display panel 10 in the curved display region 12 at a large viewing angle is emitted to the light extraction side of the display panel 10. The optical function layer 40 in the flat display region 11 and the optical function layer 40 in the curved display region 12 are differentiated such that at least part of the optical function layer 40 in the flat display region 11 has a greater light convergence capability than the optical function layer 40 in the curved display region 12. That is, the light of the display panel 10 in the flat display region 11 at a viewing angle of 0° and the light of the display panel 10 in the curved display region 12 at a large viewing angle are enhanced so that both the display panel 10 in the flat display region 11 and the display panel 10 in the curved display region 12 emit more light to the light extraction side of the display panel 10.

In an exemplary embodiment, referring to FIG. 2, the display surface of the display panel 10 in the flat display region 11 is a plane surface perpendicular to the light extraction side of the display panel 10, and the light of the display panel 10 in the flat display region 11 at a viewing angle of 0° is emitted to the light extraction side of the display panel 10; the first brightness is relatively great, and the brightness of the display panel 10 in a unit area at a viewing angle of 0° is relatively high, indicating that brightness at a large viewing angle is relatively low, so that most light of the display panel 10 in the flat display region 11 can be emitted to the light extraction side, thereby increasing brightness of the display panel 10 in a unit area of the flat display region 11 on the light extraction side.

With continued reference to FIG. 2, the display surface of the display panel 10 in the curved display region 12 is a curved surface, and the angle between the curved surface and the light extraction side of the display panel 10 is greater than 90° so that the light of the display panel 10 in the curved display region 12 at a viewing angle of 0° is emitted to a side surface of the display panel 10, and part of light at a large viewing angle may be emitted to the light extraction side of the display panel 10; the second brightness is relatively small, and the brightness of the display panel 10 in a unit area at a viewing angle of 0° is relatively low and brightness at a large viewing angle is relatively high, so that light emitted by the display panel 10 in the curved display region 12 to the side surface of the display panel 10 can be reduced, and more light is emitted to the light extraction side of the display panel 10, thereby increasing brightness of the display panel in a unit area of the curved display region 12 on the light extraction side.

In an exemplary embodiment, the optical function layer 40 on a side of the light-emitting elements 25 with different colors and in the curved display region 12 facing away from the base substrate 21 is differentiated. For example, the optical function layer 40 with a relatively weak light convergence capability is disposed on a side of a light-emitting element 25 with relatively good light convergence facing away from the base substrate 21, and the optical function layer 40 with a relatively strong light convergence capability is disposed on a side of a light-emitting element 25 with relatively poor light convergence facing away from the base substrate 21. In this manner, subpixels of different colors in the display panel 10 in the curved display region 12 can have uniform brightness at a large viewing angle so that subpixels of various colors in the curved display region 12 tend to have consistent brightness on the light extraction side of the display panel 10.

To conclude, the optical function layer is disposed on the side of the light-emitting elements facing away from the base substrate, which can change a path of light emitted by the light-emitting element, improve a light extraction rate of the display panel, and facilitate low power consumption of the display panel. At least part of the optical function layer is disposed in the flat display region, which can increase the brightness of the display panel in the flat display region at a viewing angle of 0° and reduce the brightness of the display panel in the flat display region at a large viewing angle, so that the brightness of the display panel in a unit area of the flat display region on the light extraction side can be increased and optical crosstalk between adjacent subpixels can be reduced. The second brightness is less than the first brightness so that the brightness of the display panel in the curved display region at a large viewing angle can be increased, and the display panel in the curved display region emits more light to the light extraction side of the display panel, thereby increasing the brightness of the display panel in a unit area of the curved display region on the light extraction side and alleviating the problem of a darker color in the curved display region. At the same height distance from the display surface of the display panel, the second brightness of the display panel in a unit area of the curved display region may be different, so as to make subpixels of different colors in the display panel in the curved display region have uniform brightness at a large viewing angle, so that subpixels of various colors in the curved display region tend to have consistent brightness on the light extraction side of the display panel, alleviating the problem of a color cast due to the fact that light-emitting elements of different colors decay differently in brightness as the viewing angle increases.

Figure 3:
FIG. 3 is a structure diagram of a display panel prior to bending according to an embodiment of the present disclosure.
Figure 3:
Figure 3:
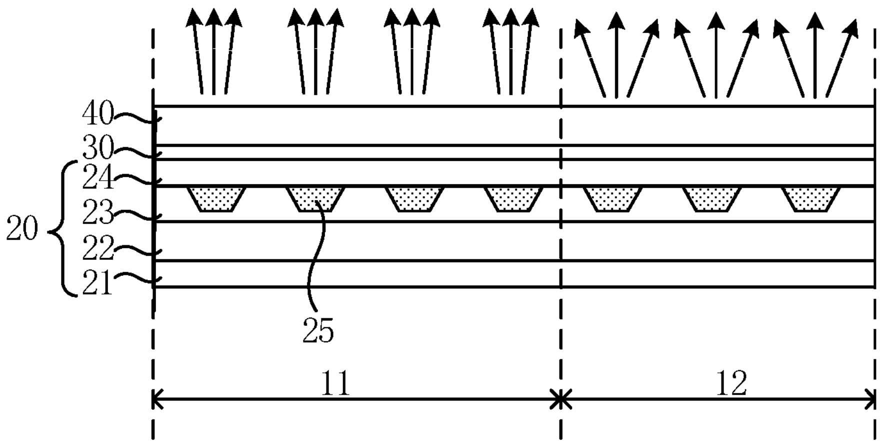

In an exemplary embodiment, FIG. 3 is a structure diagram of a display panel prior to bending according to an embodiment of the present disclosure. Referring to FIG. 3, in a preparation stage of the display panel 10, the display surface of the display panel 10 in the curved display region 12 is also a plane surface. After the preparation is completed, the display surface of the display panel 10 in the curved display region 12 may be extruded into the curved surface by a mold. For ease of understanding and description, structure diagrams of the display panel prior to bending are used as examples in some embodiments of the present disclosure.

It is to be noted that the display panel may be prepared in a 3D printing manner, that is, in the preparation stage, the display surface of the display panel in the curved display region is the curved surface and does not need to be extruded into the curved surface by the mold. The structure of the display panel obtained in the 3D printing manner is similar to that of the display panel in FIG. 3 where the finally formed display surface includes the curved surface. The details are not repeated in embodiments of the present disclosure.

Figure 4:
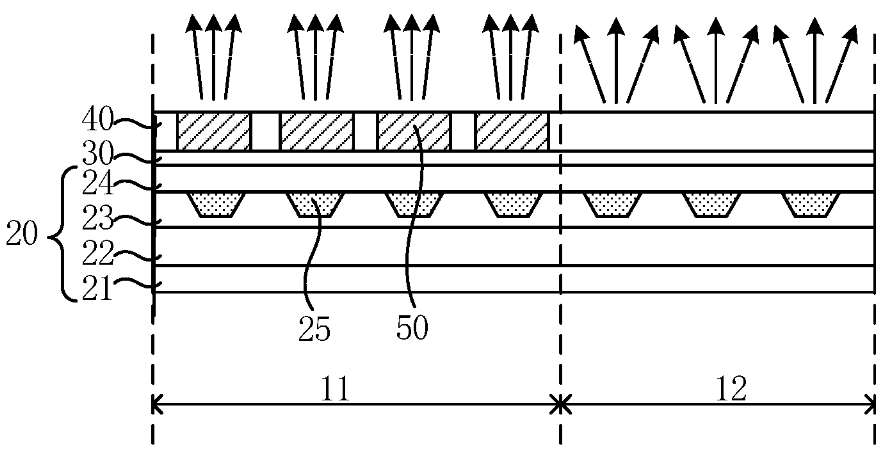
FIG. 4 is a structure diagram of another display panel prior to bending according to an embodiment of the present disclosure.

In an exemplary embodiment, FIG. 4 is a structure diagram of another display panel prior to bending according to an embodiment of the present disclosure. Referring to FIG. 4, the optical function layer 40 includes multiple light convergence regions 50, where at least part of the multiple light convergence regions 50 are disposed in the flat display region 11, and the at least part of the multiple light convergence regions 50 correspond to at least light-emitting elements 25 in the flat display region 11.

For example, the optical function layer 40 includes a light convergence region 50 and a light non-convergence region other than the light convergence region 50, where the light convergence region 50 of the optical function layer 40 has a greater light convergence capability than the light non-convergence region of the optical function layer 40. The light convergence region 50 of the optical function layer 40 may be disposed only in the flat display region 11, and the curved display region 12 may be provided with no optical function layer 40 or provided with only the light non-convergence region of the optical function layer 40. In the direction perpendicular to the display surface of the display panel 10, the light convergence regions 50 correspond to the light-emitting elements 25 in the flat display region 11, and light emitted from the light-emitting element 25 is converged towards the display surface side of the display panel 10 after passing through the light convergence region 50 of the optical function layer 40, that is, converged towards a direction of the viewing angle of 0° of the display panel 10, so that the first brightness of the display panel 10 is relatively large. The curved display region 12 is provided with no light convergence region 50, and light emitted from the light-emitting element 25 is emitted at various viewing angles, which can ensure that the brightness of the display panel 10 in the curved display region 12 at a large viewing angle is relatively high and the second brightness is relatively small.

To conclude, the light convergence regions 50 of the optical function layer 40 are disposed in at least the flat display region 11, and the light convergence regions 50 correspond to the light-emitting elements 25 in the flat display region 11 so that the brightness of the display panel 10 in a unit area of the flat display region 11 at a viewing angle of 0° can be increased, the brightness of the display panel 10 in a unit area of the flat display region 11 at a large viewing angle can be reduced, and the brightness of the display panel 10 in a unit area of the flat display region 11 on the light extraction side can be increased. The curved display region 12 is provided with no optical function layer 40 or provided with only the light non-convergence region of the optical function layer 40, which can ensure that the brightness of the display panel 10 in a unit area of the curved display region 12 at a large viewing angle is relatively high, thereby increasing the brightness of the display panel 10 in a unit area of the curved display region 12 on the light extraction side, helping to alleviate the problem of the darker color in the curved display region 12, and facilitating the low power consumption of the display panel 10.

Figure 5:
FIG. 5 is a structure diagram of another display panel prior to bending according to an embodiment of the present disclosure.
Figure 5:
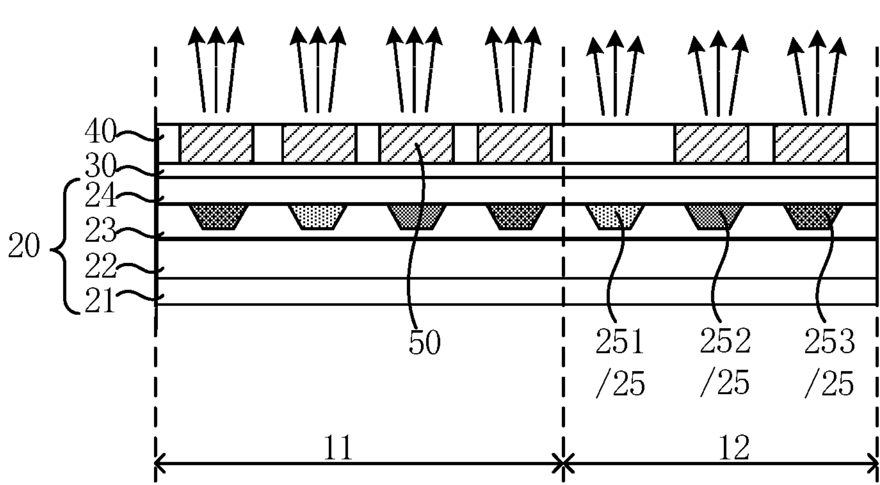

In an exemplary embodiment, the light convergence regions 50 of the optical function layer 40 are disposed in the flat display region 11 and part of the curved display region 12, and part of the curved display region 12 is provided with no light convergence region 50 of the optical function layer 40. For example, the light convergence region 50 of the optical function layer 40 is not disposed on the side of the light-emitting element 25 with relatively good light convergence and in the curved display region 12 facing away from the base substrate 21. FIG. 5 is a structure diagram of another display panel prior to bending according to an embodiment of the present disclosure. Referring to FIG. 5, the light-emitting elements 25 include a blue light-emitting element 251, a green light-emitting element 252, and a red light-emitting element 253, where in the direction perpendicular to the display surface of the display panel 10, the blue light-emitting element 251 in the curved display region 12 overlaps no light convergence region 50, and the green light-emitting element 252 and the red light-emitting element 253 in the curved display region 12 each overlap the light convergence region 50.

The blue light-emitting element 251 decays relatively fast in brightness as the viewing angle increases. That is, at the same height distance, brightness of the blue light-emitting element 251 at a viewing angle of 0° is relatively large, and the blue light-emitting element 251 has relatively good light convergence. The green light-emitting element 252 and the red light-emitting element 253 decay relatively slowly in brightness as the viewing angle increases, brightness of the green light-emitting element 252 and brightness of the red light-emitting element 253 at a viewing angle of 0° is relatively small, and the green light-emitting element 252 and the red light-emitting element 253 have relatively poor light convergence. Light convergence regions 50 are disposed on a side of the green light-emitting element 252 and the red light-emitting element 253 facing away from the base substrate 21 and can converge light emitted from the green light-emitting element 252 and the red light-emitting element 253 to achieve uniform light convergence of blue light, green light, and red light of the display panel 10 in the curved display region 12 so that at the same height distance and the same large viewing angle, blue light, green light, and red light of the display panel 10 in a unit area tend to have consistent brightness. In this manner, the problem of the color cast in the curved display region 12 due to the fact that the blue light-emitting element 251, the green light-emitting element 252, and the red light-emitting element 253 decay differently in brightness as the viewing angle increases can be alleviated.

Figure 6:
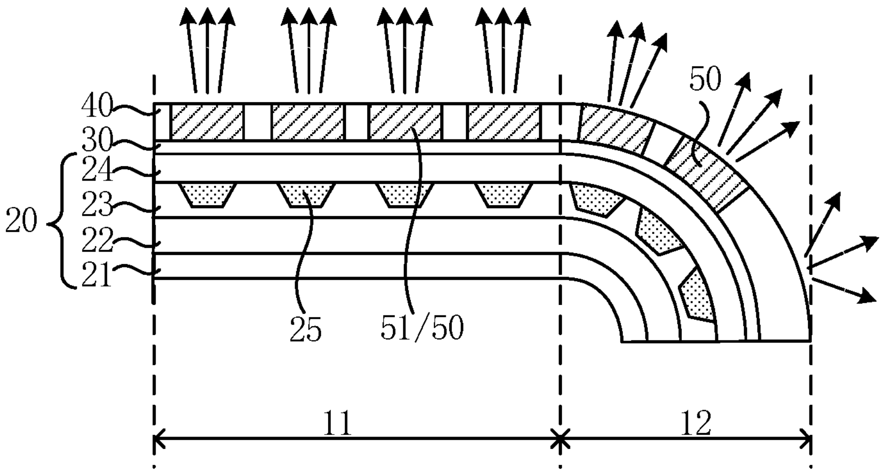
FIG. 6 is a structure diagram of another display panel according to an embodiment of the present disclosure.

In an exemplary embodiment, the light convergence region 50 of the optical function layer 40 is disposed on a side of the light-emitting element 25 closer to the flat display region 11 and disposed in the curved display region 12 facing away from the base substrate 21, and the light convergence region 50 of the optical function layer 40 is not disposed on a side of the light-emitting element 25 farther from the flat display region 11 and disposed in the curved display region 12 facing away from the base substrate 21. FIG. 6 is a structure diagram of another display panel according to an embodiment of the present disclosure. Referring to FIG. 6, the curved display region 12 may be divided into two parts, and the curved display region 12 includes a part closer to the flat display region 11 and a part farther from the flat display region 11; and in the direction perpendicular to the display surface of the display panel 10, the light-emitting element 25 in the part closer to the flat display region 11 overlaps the light convergence region 50, and the light-emitting element 25 in the part farther from the flat display region 11 overlaps no light convergence region 50.

For example, when the display surface of the display panel 10 in the curved display region 12 is a curved surface, the angle between the part closer to the flat display region 11 and the display surface of the flat display region 11 is relatively small, and the display panel 10 in the part closer to the flat display region 11 emits light to the light extraction side at a relatively small viewing angle. For example, the viewing angle ranges from 0° to 40°. The angle between the part farther from the flat display region 11 and the display surface of the flat display region 11 is relatively large, and the display panel 10 in the part farther from the flat display region 11 emits light to the light extraction side at a relatively large viewing angle. For example, the viewing angle ranges from 40° to 80°.

At the same height distance from the display surface of the display panel 10, the better light convergence light emitted from the display panel 10 has on the display surface side, the higher the brightness of the display panel in a unit area at a viewing angle of 0° and the lower the brightness at a large viewing angle; on the contrary, the poorer light convergence the light emitted from the display panel 10 has on the display surface side, the lower the brightness of the display panel in a unit area at a viewing angle of 0° and the higher the brightness at a large viewing angle. The light convergence region 50 is disposed in the part closer to the flat display region 11 to correspond to the light-emitting element 25 and has a relatively strong light convergence capability for the light emitted from the light-emitting element 25 so that brightness at a small viewing angle can be increased and the brightness of the display panel 10 in the part closer to the flat display region 11 at a viewing angle of 0° to 40° is relatively high. The light convergence region 50 is not disposed in the part farther from the flat display region 11, which can ensure that the brightness of the display panel 10 in the part farther from the flat display region 11 at a viewing angle of 40° to 80° is relatively high. In this manner, the brightness of the display panel 10 in the part closer to the flat display region 11 on the light extraction side can tend to be consistent with the brightness of the display panel 10 in the part farther from the flat display region 11 on the light extraction side, the display panel 10 in the curved display region 12 has uniform brightness on the light extraction side, and the problem of display non-uniformity due to different viewing angles at which the display panel 10 at different positions of the curved display region 12 emits light to the light extraction side is alleviated.

Figure 7:
FIG. 7 is a structure diagram of another display panel prior to bending according to an embodiment of the present disclosure.
Figure 7:
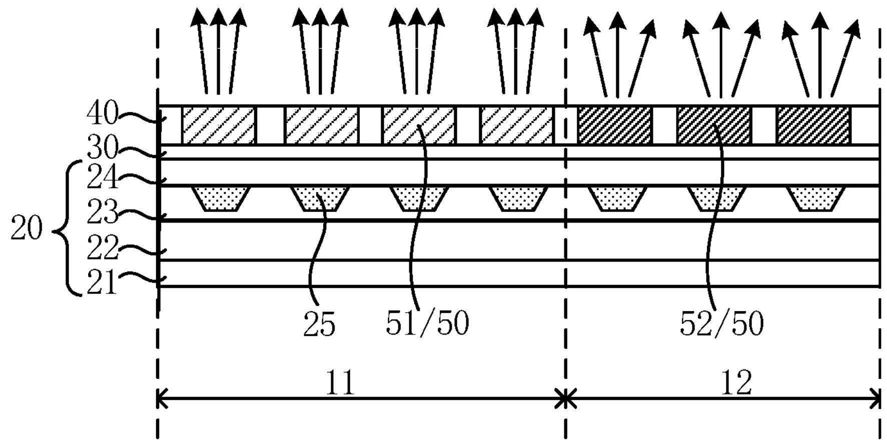

In an exemplary embodiment, when the light convergence regions 50 have different light convergence capabilities, the light convergence region 50 with a relatively weak light convergence capability may be disposed in at least the optical function layer in the curved display region 12, that is, at least part of light convergence regions 50 with a relatively weak light convergence capability correspond to part of light-emitting elements 25 in the curved display region 12. FIG. 7 is a structure diagram of another display panel prior to bending according to an embodiment of the present disclosure. Referring to FIG. 7, the light convergence regions 50 include first light convergence regions 51 in the flat display region 11 and second light convergence regions 52 in the curved display region 12, where a first light convergence region 51 has a greater light convergence capability than a second light convergence region 52; and at least part of the first light convergence regions 51 correspond to at least part of the light-emitting elements 25 in the flat display region 11, and the second light convergence regions 52 correspond to at least part of the light-emitting elements 25 in the curved display region 12.

For example, the first light convergence regions 51 of the optical function layer 40 correspond to the light-emitting elements 25 in the flat display region 11, and the second light convergence regions 52 of the optical function layer 40 correspond to the light-emitting elements 25 in the curved display region 12. The first light convergence region 51 has a relatively large light convergence effect on the light-emitting element 25, and the second light convergence region 52 has a relatively small light convergence effect on the light-emitting element 25. At the same height distance from the display surface of the display panel 10, the first light convergence region 51 makes the brightness of the display panel 10 in a unit area of the flat display region 11 at a viewing angle of 0° relatively high, and the second light convergence region 52 makes the brightness of the display panel 10 in a unit area of the curved display region 12 at a large viewing angle relatively high. In one aspect, the optical function layer 40 in the flat display region 11 and the optical function layer 40 in the curved display region 12 are differentiated so that a brightness difference between the brightness of the display panel 10 in the flat display region 11 on the light extraction side and the brightness of the display panel 10 in the curved display region 12 on the light extraction side is reduced, the luminescence intensity of the display panel 10 on the light extraction side is balanced, and the problem of the darker color in the curved display region 12 is alleviated. In another aspect, the first light convergence region 51 and the second light convergence region 52 each have a light convergence effect on the light emitted from the light-emitting element 25 so that the light is converged towards the display surface side, the light extraction rate of the display panel 10 can be increased, and the low power consumption of the display panel 10 is facilitated.

Figure 8:
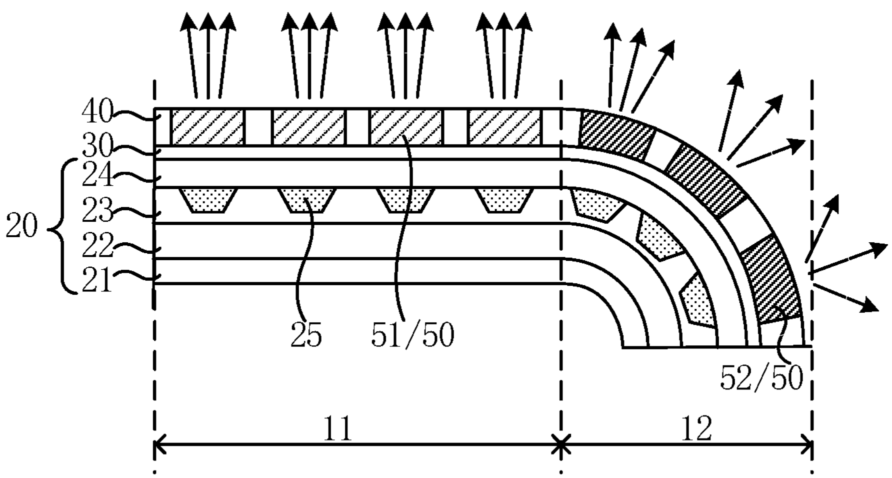
FIG. 8 is a structure diagram of another display panel according to an embodiment of the present disclosure.

In an exemplary embodiment, FIG. 8 is a structure diagram of another display panel according to an embodiment of the present disclosure. Referring to FIG. 8, at the same height distance from the display surface of the display panel 10, second brightness of at least part of the display panel 10 closer to the flat display region 11 is greater than second brightness of the display panel 10 farther from the flat display region 11.

For example, when the display surface of the display panel 10 in the curved display region 12 is a curved surface, the display panel 10 closer to the flat display region 11 emits light to the light extraction side at a smaller viewing angle than the display panel 10 farther from the flat display region 11 emits light to the light extraction side. In the curved display region 12, the second light convergence region 52 closer to the flat display region 11 has a greater light convergence capability than the second light convergence region 52 farther from the flat display region 11 so that the brightness of the display panel 10 closer to the flat display region 11 at a small viewing angle is relatively high, and the brightness of the display panel 10 in a unit area and farther from the flat display region 11 at a large viewing angle is relatively high. In this manner, the brightness of the display panel 10 in the part closer to the flat display region 11 on the light extraction side can tend to be consistent with the brightness of the display panel 10 in the part farther from the flat display region 11 on the light extraction side, the display panel 10 in the curved display region 12 has uniform brightness on the light extraction side, and the problem of display non-uniformity in the curved display region 12 is alleviated.

Figure 9:
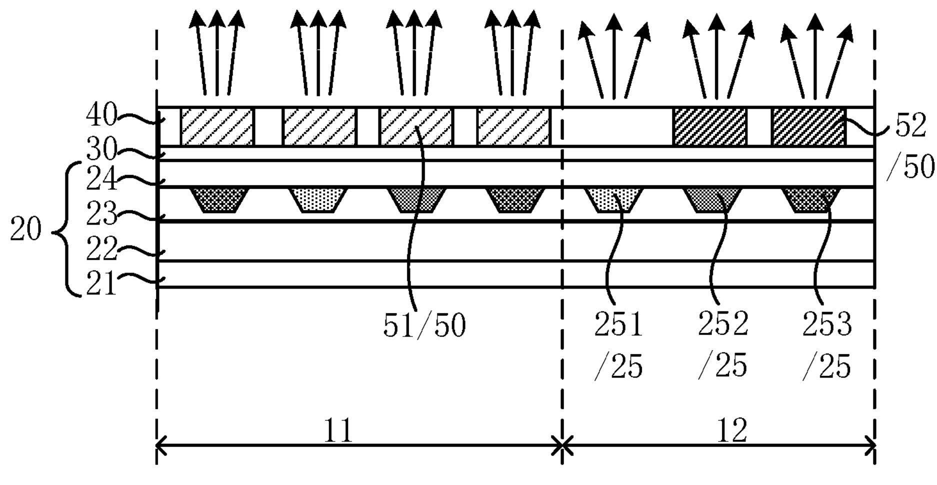
FIG. 9 is a structure diagram of another display panel prior to bending according to an embodiment of the present disclosure.

In an exemplary embodiment, FIG. 9 is a structure diagram of another display panel prior to bending according to an embodiment of the present disclosure. Referring to FIG. 9, in the direction perpendicular to the display surface of the display panel 10, the blue light-emitting element 251 in the curved display region 12 overlaps no light convergence region 50, and the green light-emitting element 252 and the red light-emitting element 253 in the curved display region 12 each overlap the second light convergence region 52.

In an example, the blue light-emitting element 251 has relatively good light convergence, and the green light-emitting element 252 and the red light-emitting element 253 have relatively poor light convergence. After the light emitted from the green light-emitting element 252 and the red light-emitting element 253 in the curved display region 12 passes through the second light convergence regions 52, the second light convergence regions 52 may converge the light emitted from the green light-emitting element 252 and the red light-emitting element 253 towards the display surface side of the display panel 10 so that the light convergence of the blue light, the green light, and the red light of the display panel 10 in the curved display region 12 can be uniform, and the light convergence of the blue light, the green light, and the red light of the display panel 10 in the curved display region 12 is less than light convergence of blue light, green light, and red light of the display panel 10 in the flat display region 11. In this manner, at the same height distance and the same large viewing angle, the blue light, the green light, and the red light of the display panel 10 in a unit area of the curved display region 12 have relatively high brightness and tend to have consistent brightness on the light extraction side, thereby alleviating the problems of the color cast and the darker color in the curved display region 12.

Figure 10:
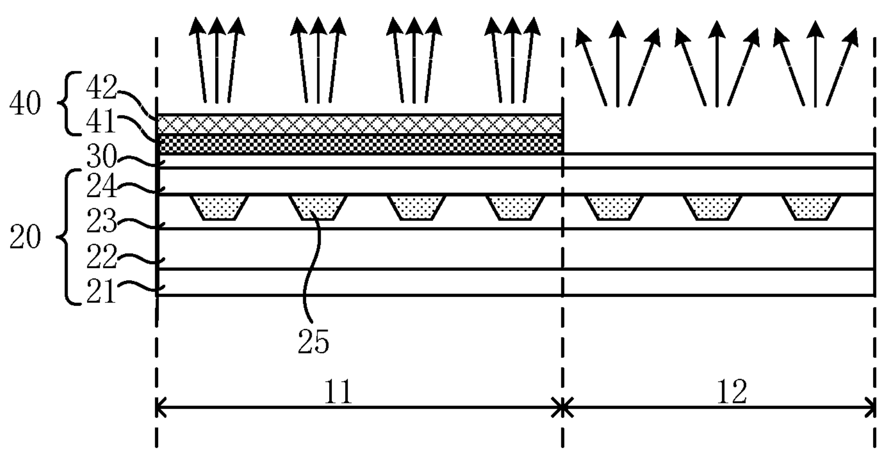
FIG. 10 is a structure diagram of another display panel prior to bending according to an embodiment of the present disclosure.

In an exemplary embodiment, FIG. 10 is a structure diagram of another display panel prior to bending according to an embodiment of the present disclosure. Referring to FIG. 10, the optical function layer 40 includes a first optical function layer 41 on the side of the light-emitting elements 25 facing away from the base substrate 21 and a second optical function layer 42 on a side of the first optical function layer 41 facing away from the light-emitting elements 25, where the second optical function layer 42 has a greater refractive index than the first optical function layer 41.

Figure 11:
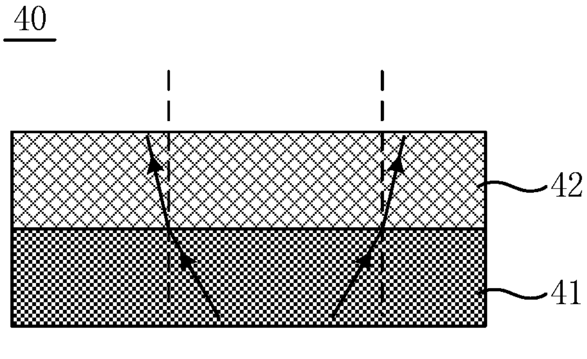
FIG. 11 is a schematic diagram of a light path in an optical function layer according to an embodiment of the present disclosure.

For example, the optical function layer 40 is disposed only in the flat display region 11. In this case, the optical function layer 40 in the curved display region 12 has a thickness of 0. Light emitted from the light-emitting element 25 in the flat display region 11 is refracted at a contact surface between the first optical function layer 41 and the second optical function layer 42. As shown in FIG. 11, the first optical function layer 41 and the second optical function layer 42 work together so that the light emitted from the light-emitting element 25 in the flat display region 11 is slightly converged toward the display surface side of the display panel 10 after passing through the optical function layer 40, making the first brightness of the display panel 10 relatively large. In this manner, the optical function layer 40 can increase the brightness of the display panel 10 in a unit area of the flat display region 11 on the light extraction side and reduce the optical crosstalk between subpixels. The optical function layer in the curved display region has a thickness of 0 so that light emitted from the light-emitting element 25 in the curved display region 12 is not converged towards the display surface side, the second brightness of the display panel 10 is relatively small, and the brightness of the display panel 10 in the curved display region 12 at a large viewing angle is relatively high. When the display surface of the display panel 10 in the curved display region 12 is the curved surface, the display panel 10 in the curved display region 12 can emit more light to the light extraction side of the display panel 10, thereby increasing the brightness of the display panel 10 in the curved display region 12 on the light extraction side and alleviating the problem of the darker color in the curved display region 12.

Figure 12:
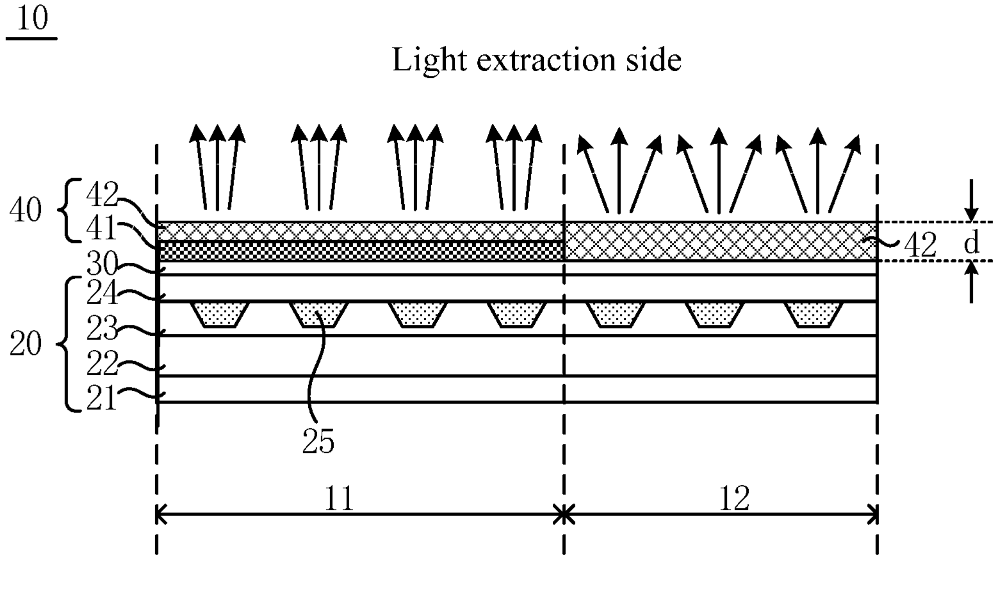
FIG. 12 is a structure diagram of another display panel prior to bending according to an embodiment of the present disclosure.

Alternatively, the optical function layer 40 is disposed in the flat display region 11 and the curved display region 12. In this case, the optical function layer 40 in the curved display region has a thickness greater than 0. FIG. 12 is a structure diagram of another display panel prior to bending according to an embodiment of the present disclosure. Referring to FIG. 12, the optical function layer 40 in the curved display region 12 includes only the second optical function layer 42. A path of the light emitted from the light-emitting element 25 in the curved display region 12 is not changed in the optical function layer 40, the light is not converged towards the display surface side, and brightness of the light-emitting element 25 in the curved display region 12 at a large viewing angle is not reduced so that the brightness of the display panel 10 in the curved display region 12 on the light extraction side can be increased and the problem of the darker color in the curved display region 12 can be alleviated. Additionally, the second optical function layer 42 in the curved display region 12 may be prepared in the same procedure as the second optical function layer 42 in the flat display region 11, the optical function layer 40 in the curved display region 12 does not need to be removed by a procedure, and another transparent structure does not need to be filled on the side of the light-emitting elements 25 in the curved display region 12 facing away from the base substrate 21 so that procedures can be simplified, and preparation efficiency can be improved.

It is to be understood that when the optical function layer 40 is disposed in the flat display region 11 and the curved display region 12, the optical function layer 40 in the curved display region 12 may include only the first optical function layer 41, which can also increase the brightness of the display panel 10 in the curved display region 12 on the light extraction side and alleviate the problem of the darker color in the curved display region 12. The principle is the same as that in the preceding embodiment. The details are not repeated here.

In an exemplary embodiment, the optical function layer 40 in the curved display region 12 has a thickness d within a value range of 26 μm≤d≤31 μm.

For example, the thickness d of the optical function layer 40 in the curved display region 12 has the same value range as the thickness of the optical function layer in the flat display region 11 so that a step between the display panel 10 in the flat display region 11 and the display panel 10 in the curved display region 12 can be reduced, the consistency of the height of the surface of the optical function layer 40 can be improved, and subsequent procedures and a product yield can be facilitated.

In an exemplary embodiment, the optical function layer 40 is disposed in the flat display region 11 and the curved display region 12, and the optical function layer 40 in the curved display region 12 includes the first optical function layer 41 and the second optical function layer. The optical function layer 40 in the flat display region 11 and the optical function layer 40 in the curved display region 12 may be differentiated through a change of the contact surface between the first optical function layer 41 and the second optical function layer 42 so that at least part of the optical function layer 40 in the flat display region 11 has a greater light convergence capability than the optical function layer 40 in the curved display region 12. Therefore, at the same height distance from the display surface of the display panel 10, the first brightness of at least part of the display panel 10 is greater than the second brightness.

Figure 13:
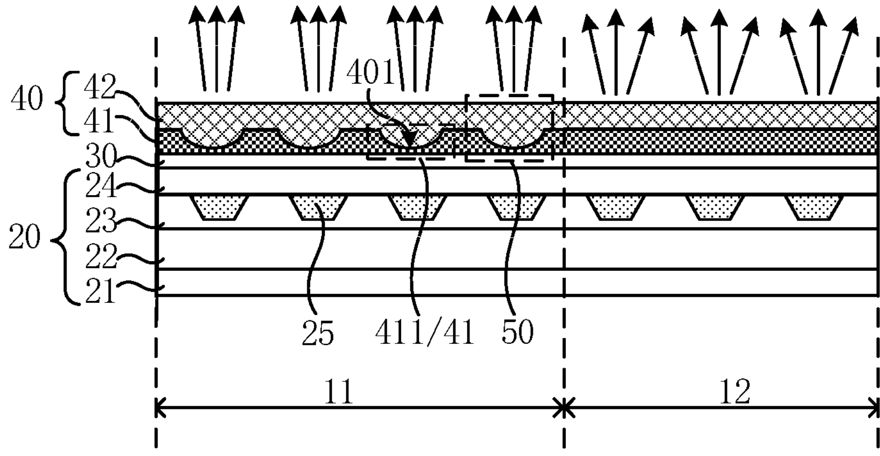
FIG. 13 is a structure diagram of another display panel prior to bending according to an embodiment of the present disclosure.

In an exemplary embodiment, the light convergence capability of the light convergence region 50 is implemented by a microstructure of the optical function layer 40. FIG. 13 is a structure diagram of another display panel prior to bending according to an embodiment of the present disclosure. Referring to FIG. 13, the first optical function layer 41 includes multiple first microlenses 411; where the multiple first microlenses 411 are disposed in the multiple light convergence regions 50; in the direction perpendicular to the display surface of the display panel 10, the multiple first microlenses 411 overlap at least the light-emitting elements 25 in the flat display region 11; and a surface of each first microlens 411 in contact with the second optical function layer 42 is a first surface 401, the first surface 401 is curved, and the first surface 401 is convex towards the first optical function layer 41.

Figure 14:
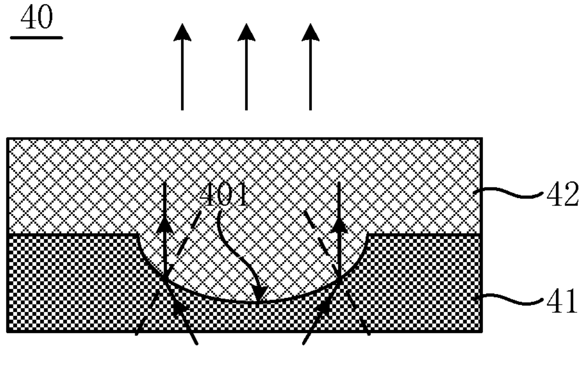
FIG. 14 is a schematic diagram of another light path in an optical function layer according to an embodiment of the present disclosure.

For example, FIG. 14 is a schematic diagram of another light path in an optical function layer according to an embodiment of the present disclosure. Referring to FIGS. 13 and 14, the contact surface between the first optical function layer 41 and the second optical function layer 42 is an uneven structure, and the first surface 401 is convex towards the first optical function layer 41 so that the first microlens 411 of the first optical function layer 41 is a concave lens, the second optical function layer 42 cooperates with the first microlens 411 of the first optical function layer 41, and the second optical function layer 42 includes a convex lens corresponding to the first microlens 411. When the light emitted from the light-emitting element 25 in the flat display region 11 is emitted from the first optical function layer 41 with a relatively small refractive index to the second optical function layer 42 with a relatively large refractive index and the convex lens, the light is converged towards the display surface side of the display panel 10 so that the first brightness of at least part of the display panel 10 is relatively large.

In an exemplary embodiment, in the direction perpendicular to the display surface of the display panel 10, at least part of the light-emitting elements 25 in the curved display region 12 does not overlap the first microlens 411. When the light emitted from the light-emitting elements 25 is emitted from the first optical function layer 41 with a relatively small refractive index to the second optical function layer with a relatively large refractive index and the contact surface is a plane surface parallel to the display surface, the light is also converged towards the display surface side of the display panel 10 but is converged relatively weakly towards the display surface side so that the second brightness of the display panel is relatively small.

Compared with the structure in which the contact surface between the second optical function layer 42 and the first optical function layer 41 is the plane surface, the first surface 401 provided in the embodiment of the present disclosure is curved and convex towards the first optical function layer 41 so that a certain angle exists between a normal to the first surface 401 and the light extraction side of the display panel 10, and directions of normals are converged on the light extraction side. When the light emitted from the light-emitting element 25 is incident to the second optical function layer 42, the light emitted from the light-emitting element 25 can approach the direction of the normal to be converged towards the display surface side. In this manner, the light convergence capability of the light convergence region 50 can be enhanced, thereby increasing the light extraction rate of the display panel 10. Meanwhile, in the direction perpendicular to the display surface of the display panel 10, at least part of the first microlenses 411 do not overlap the light-emitting elements 25 in the curved display region 12 so that at the same height distance from the display surface of the display panel, the first brightness of at least part of the display panel 10 is greater than the second brightness, thereby alleviating the problems of the darker color and the color cast in the curved display region 12.

Figure 15:
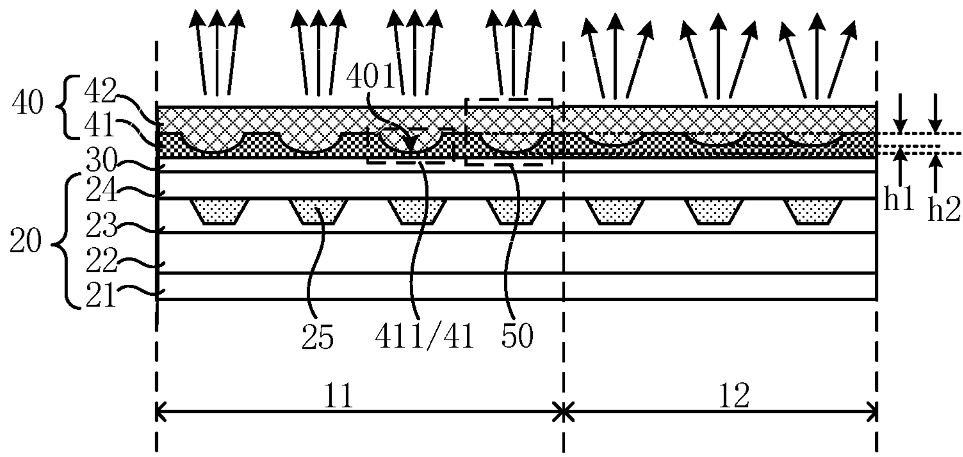
FIG. 15 is a structure diagram of another display panel prior to bending according to an embodiment of the present disclosure.

In an exemplary embodiment, FIG. 15 is a structure diagram of another display panel prior to bending according to an embodiment of the present disclosure. Referring to FIG. 15, a protrusion height h1 of the first surface 401 in the curved display region 12 is less than or equal to a protrusion height h2 of the first surface 401 in the flat display region 11.

Figure 16:
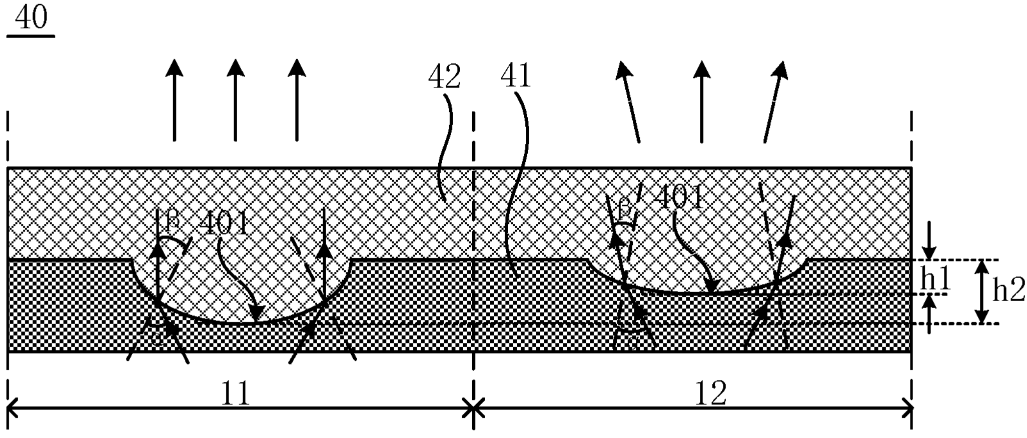
FIG. 16 is a schematic diagram of another light path in an optical function layer according to an embodiment of the present disclosure.

For example, FIG. 16 is a schematic diagram of another light path in an optical function layer according to an embodiment of the present disclosure. Referring to FIGS. 15 and 16, when the protrusion height of the first surface 401 is relatively small, the curvature of the first surface 401 is relatively small, the angle between the normal to the first surface 401 and the light extraction side of the display panel 10 is relatively small, and the directions of the normals are less converged towards the display surface side. For light in the same direction, the smaller the protrusion height of the first surface 401, the smaller the angle α of incidence of the light to the first surface 401. According to sin β=n2/n1/sin α, a refraction angle β of the light on the first surface 401 increases, and the light is less converged towards the display surface side in conjunction with the fact that the normal is less converged towards the light extraction side.

With continued reference to FIGS. 15 and 16, the light convergence region 50 in the curved display region 12 includes the first microlens 411 and the first surface 401 with a relatively small protrusion height, and light convergence regions 50 in the curved display region 12 correspond to at least part of the light-emitting elements 25 in the curved display region 12. In this manner, the brightness of at least part of the display panel 10 in the curved display region 12 at a viewing angle of 0° can be reduced so that the second brightness of at least part of the display panel 10 is relatively small, the brightness of at least part of the display panel 10 in the curved display region 12 at a large viewing angle is relatively high, the brightness difference between the brightness of the display panel 10 in a unit area of the flat display region 11 on the light extraction side and the brightness of the display panel 10 in a unit area of the curved display region 12 on the light extraction side is reduced, the luminescence intensity of the display panel 10 on the light extraction side is balanced, and the problem of the darker color in the curved display region 12 is alleviated.

Figures 17, 18:
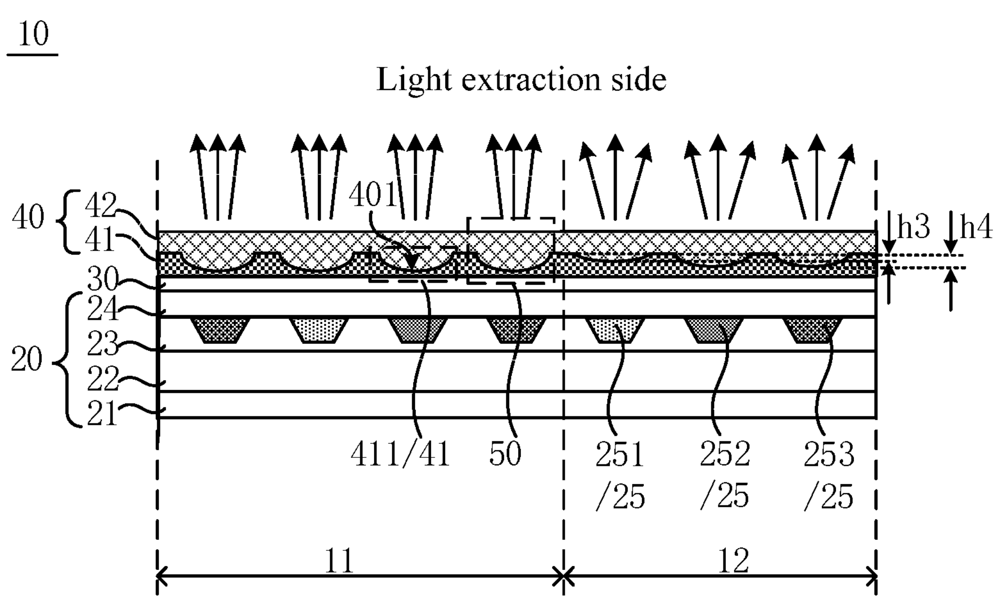
FIG. 17 is a structure diagram of another display panel prior to bending according to an embodiment of the present disclosure.
FIG. 18 is a structure diagram of another display panel prior to bending according to an embodiment of the present disclosure.

In an exemplary embodiment, FIG. 17 is a structure diagram of another display panel prior to bending according to an embodiment of the present disclosure. Referring to FIG. 17, in the direction perpendicular to the display surface of the display panel 10, a protrusion height of the first surface 401 overlapping the blue light-emitting element 251 in the curved display region 12 is a first height h3, a protrusion height of the first surface 401 overlapping the green light-emitting element 252 or the red light-emitting element 253 in the curved display region 12 is a second height h4, where the first height h3 is less than the second height h4.

In an example, the first surface 401 overlapping the blue light-emitting element 251 in the curved display region 12 in the direction perpendicular to the display surface of the display panel 10 has a relatively small curvature. When light emitted from the blue light-emitting element 251 is refracted on the first surface 401, the light is converged relatively weakly towards the display surface side. The first surface 401 overlapping the green light-emitting element 252 or the red light-emitting element 253 in the curved display region 12 in the direction perpendicular to the display surface of the display panel 10 has a relatively large curvature. When light emitted from the green light-emitting element 252 or the red light-emitting element 253 is refracted on the first surface 401, the light is converged relatively strongly towards the display surface side. In this manner, the light convergence of the blue light, the green light, and the red light of the display panel 10 in the curved display region 12 can be uniform so that at the same height distance and the same large viewing angle, the blue light, the green light, and the red light of the display panel 10 in a unit area of the curved display region 12 tend to have consistent brightness, thereby alleviating the problem of the color cast in the curved display region 12 due to the fact that the blue light-emitting element 251, the green light-emitting element 252, and the red light-emitting element 253 decay differently in brightness as the viewing angle increases.

In an exemplary embodiment, FIG. 18 is a structure diagram of another display panel prior to bending according to an embodiment of the present disclosure. Referring to FIG. 18, in the curved display region 12, a protrusion height of the first surface 401 closer to the flat display region 11 is greater than a protrusion height of the first surface 401 farther from the flat display region 11.

In an example, as the distance between the first surface 401 and the flat display region 11 increases, the curvature of the first surface 401 gradually decreases, and the convergence of the directions of the normals towards the display surface side gradually weakens. For light in the same direction, as the distance from the flat display region 11 increases, the convergence of the light towards the display surface side gradually weakens, and the second brightness of the display panel 10 is increasingly small. Therefore, at the same height distance from the display surface of the display panel 10, the second brightness of the display panel 10 closer to the flat display region 11 is greater than the second brightness of the display panel 10 farther from the flat display region 11, the brightness of the display panel 10 in a unit area and closer to the flat display region 11 at a small viewing angle is relatively high, and the brightness of the display panel 10 in a unit area and farther from the flat display region 11 at a large viewing angle is relatively high so that the display panel 10 in the curved display region 12 can have uniform brightness on the light extraction side, and the problem of display non-uniformity due to different viewing angles at which the display panel 10 at different positions of the curved display region 12 emits light to the light extraction side can be alleviated.

Figure 19:
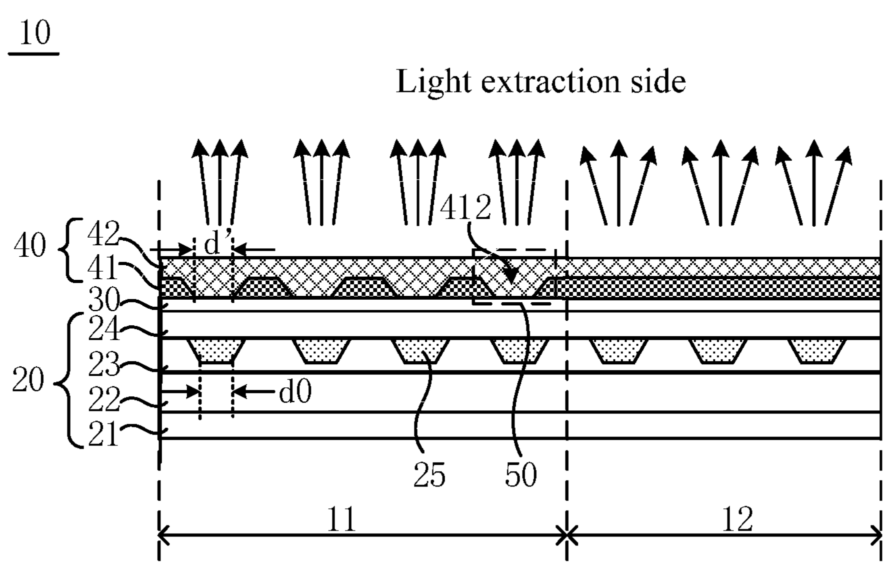
FIG. 19 is a structure diagram of another display panel prior to bending according to an embodiment of the present disclosure.

In an exemplary embodiment, FIG. 19 is a structure diagram of another display panel prior to bending according to an embodiment of the present disclosure. Referring to FIG. 19, the first optical function layer 41 includes multiple first openings 412; where the multiple first openings 412 are disposed in the multiple light convergence regions 50; in the direction perpendicular to the display surface of the display panel 10, the multiple first openings 412 overlap at least the light-emitting elements 25 in the flat display region 11; and a side of a first opening 412 facing the light-emitting elements 25 has a smaller dimension than a side of the first opening 412 facing away from the light-emitting elements 25.

Figure 20:
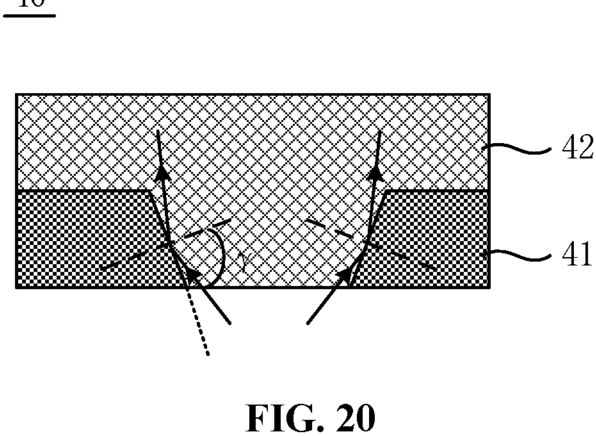
FIG. 20 is a schematic diagram of another light path in an optical function layer according to an embodiment of the present disclosure.

For example, the light convergence region 50 includes the first optical function layer 41 forming the first opening 412 and the second optical function layer 42 filled in the first opening 412. The path of the light emitted from the light-emitting element 25 is changed at the contact surface between the first optical function layer 41 and the second optical function layer 42 so that the light emitted from the light-emitting element 25 is converged towards the display surface side of the display panel 10, as shown in FIG. 20. Light emitted from the light-emitting element 25 at a small viewing angle may directly pass through the first opening 412 and be emitted to the display surface side of the display panel 10 only through the second optical function layer 42, and part of light at a relatively large viewing angle is emitted to a sidewall of the first opening 412 and from the second optical function layer 42 with a relatively large refractive index to the first optical function layer 41 with a relatively small refractive index. Therefore, when the angle $\gamma$ of incidence is large enough, the light emitted from the light-emitting element 25 at a large viewing angle may be totally reflected by the sidewall of the first opening 412, reflected back to the second optical function layer, and converged towards the display surface side of the display panel 10. In this manner, the light convergence capability of the light convergence region 50 can be enhanced, thereby increasing the light extraction rate of the display panel 10.

In an exemplary embodiment, with continued reference to FIG. 19, in a direction parallel to the display surface of the display panel 10, a minimum dimension d' of the first opening 412 is greater than or equal to a minimum dimension d0 of the light-emitting element 25. In this manner, most of the light emitted from the light-emitting element 25 can reach the first opening 412; in particular, more light at a relatively large viewing angle can reach the sidewall of the first opening 412, helping the light convergence region 50 to converge the light emitted from the light-emitting element 25.

Figure 21:
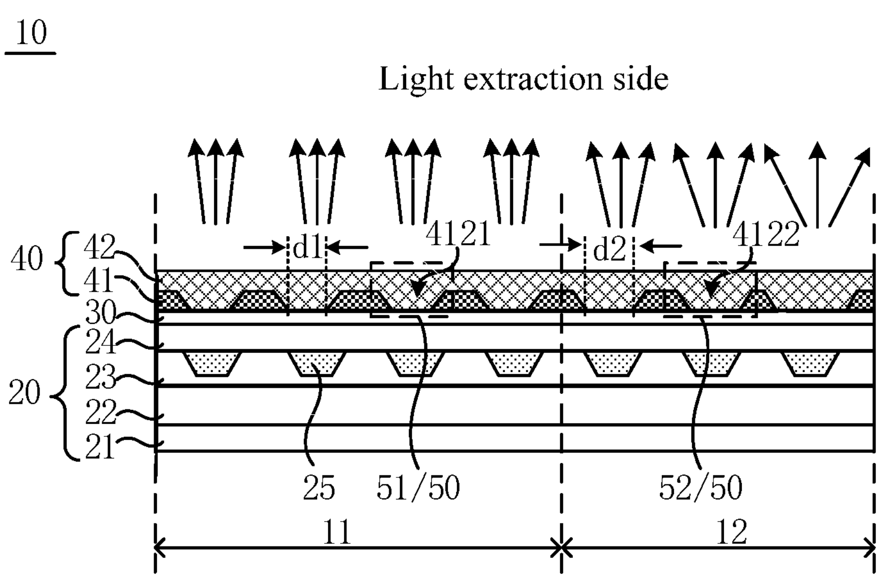
FIG. 21 is a structure diagram of another display panel prior to bending according to an embodiment of the present disclosure.

In an exemplary embodiment, FIG. 21 is a structure diagram of another display panel prior to bending according to an embodiment of the present disclosure. Referring to FIG. 21, the multiple first openings 412 include first sub-openings 4121 in the flat display region 11 and second sub-openings 4122 in the curved display region 12; in the direction perpendicular to the display surface of the display panel 10, at least part of the first sub-openings 4121 overlap at least part of the light-emitting elements 25 in the flat display region 11, and the second sub-openings 4122 overlap at least part of the light-emitting elements 25 in the curved display region 12; and in the direction parallel to the display surface of the display panel 10, each first sub-opening 4121 has a minimum dimension d1, each second sub-opening 4122 has a minimum dimension d2, where d1<d2.

Figure 22:
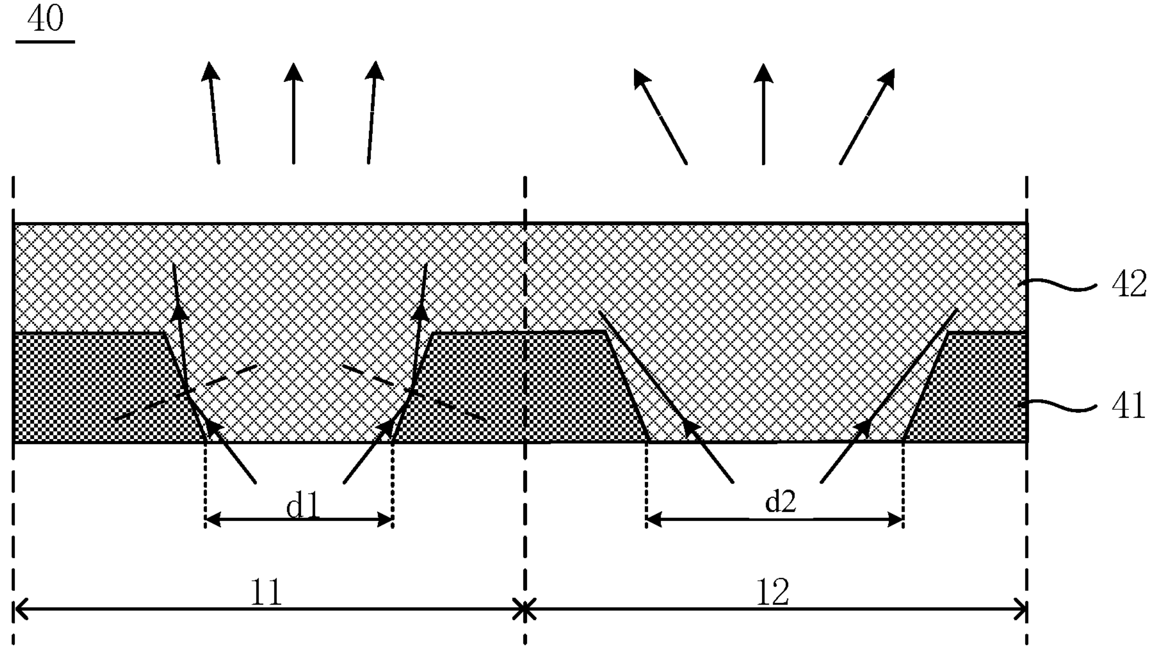
FIG. 22 is a schematic diagram of another light path in an optical function layer according to an embodiment of the present disclosure.

For example, FIG. 22 is a schematic diagram of another light path in an optical function layer according to an embodiment of the present disclosure. Referring to FIGS. 21 and 22, in the direction parallel to the display surface of the display panel 10, the minimum dimension d2 of the second sub-opening 4122 is relatively large, light emitted from the light-emitting element 25 at a small viewing angle and part of light at a large viewing angle directly pass through the second sub-opening 4122 and are emitted to the display surface side of the display panel 10 only through the second optical function layer so that part of light emitted at a large viewing angle by at least part of the light-emitting elements 25 in the curved display region 12 is not converged towards the display surface side of the display panel 10, thereby ensuring that the brightness of at least part of the display panel 10 in the curved display region 12 at a large viewing angle is not reduced and alleviating the problem of insufficient brightness of the display panel 10 in the curved display region 12 on the light extraction side. In an example, $0.1\ \mu m \le d2-d1 \le 2\ \mu m$.

Figures 23, 24:
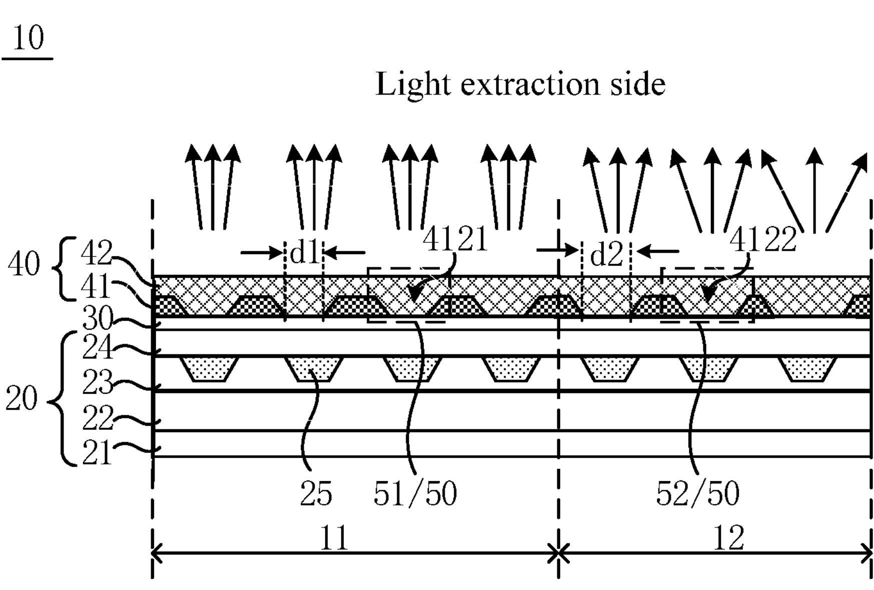
FIG. 23 is a structure diagram of another display panel prior to bending according to an embodiment of the present disclosure.
FIG. 24 is a structure diagram of another display panel prior to bending according to an embodiment of the present disclosure.

In an exemplary embodiment, FIG. 23 is a structure diagram of another display panel prior to bending according to an embodiment of the present disclosure. In the curved display region, in the direction parallel to the display surface of the display panel 10, a minimum dimension of the second sub-opening 4122 closer to the flat display region 11 is less than a minimum dimension of the second sub-opening 4122 farther from the flat display region 11.

In an example, as the distance between the second sub-opening 4122 and the flat display region 11 increases, the minimum dimension of the second sub-opening 4122 gradually increases, an increasingly small amount of light of the light emitted from the light-emitting element 25 may reach a sidewall of the second sub-opening 4122, and the second brightness of the display panel 10 is increasingly small. At the same large viewing angle, the brightness of the display panel 10 in a unit area and closer to the flat display region 11 is less than the brightness of the display panel 10 in a unit area and farther from the flat display region 11, that is, the brightness of the display panel 10 in a unit area and closer to the flat display region 11 at a small viewing angle is relatively high, and the brightness of the display panel 10 in a unit area and farther from the flat display region 11 at a large viewing angle is relatively high, thereby alleviating the problem of display non-uniformity due to different viewing angles at which the display panel 10 at different positions of the curved display region 12 emits light to the light extraction side.

Figure 25:
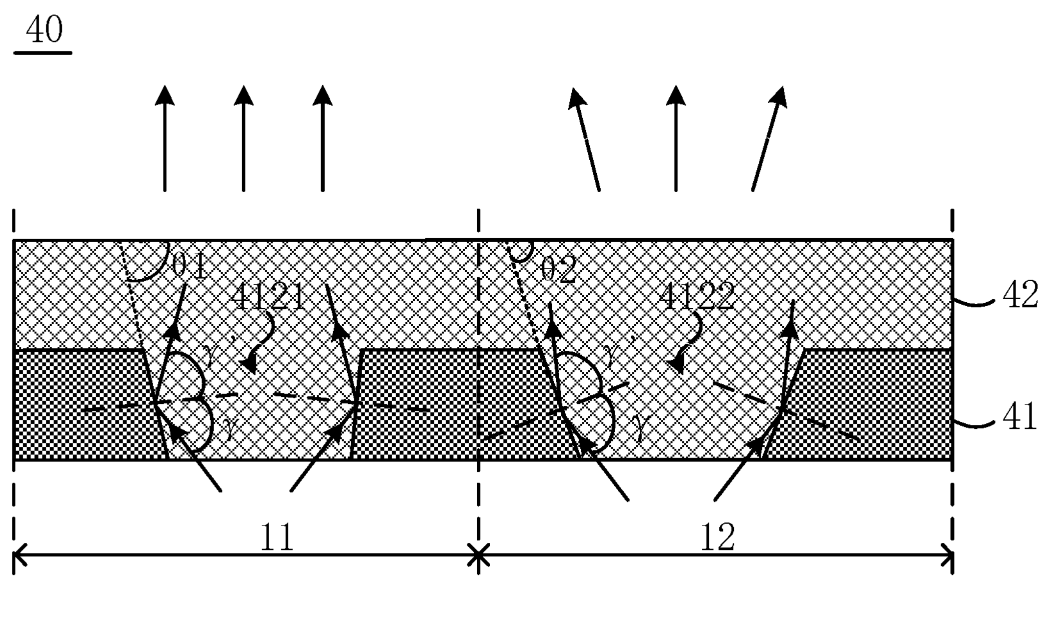
FIG. 25 is a schematic diagram of another light path in an optical function layer according to an embodiment of the present disclosure.

In an exemplary embodiment, FIG. 24 is a structure diagram of another display panel prior to bending according to an embodiment of the present disclosure, and FIG. 25 is a schematic diagram of another light path in an optical function layer according to an embodiment of the present disclosure. Referring to FIGS. 24 and 25, the angle between a sidewall of the first sub-opening 4121 and the display surface is a first angle θ1; the angle between the sidewall of the second sub-opening 4122 and the display surface is a second angle θ2; and the first angle θ1 and the second angle θ2 are less than 90°, and the first angle θ1 is greater than the second angle θ2.

In an example, the first angle θ1 is greater than the second angle θ2, the angle between a normal to the sidewall of the first sub-opening 4121 and the light extraction side of the display panel 10 is relatively large, the direction of the normal is converged relatively strongly towards the display surface side, the angle between a normal to the sidewall of the second sub-opening 4122 and the light extraction side of the display panel 10 is relatively small, and the direction of the normal is converged relatively weakly towards the display surface side. For light in the same direction, the angle γ of incidence of the light to the sidewall of the first sub-opening 4121 is relatively small, and the reflection angle γ' is also relatively small; the angle γ of incidence of the light to the sidewall of the second sub-opening 4122 is relatively large, and the reflection angle γ' is also relatively large. In conjunction with the reflection angles γ' of the light relative to the first sub-opening 4121 and the reflection angles γ' of the light relative to the second sub-opening 4122 and the directions of the normal to the sidewall of the first sub-opening 4121 and the normal to the sidewall of the second sub-opening 4122, the light is converged relatively strongly towards the display surface side after being totally reflected by the sidewall of the first sub-opening 4121, and the light is converged relatively weakly towards the display surface side after being totally reflected by the sidewall of the second sub-opening 4122. Additionally, since the second angle θ2 between the sidewall of the second sub-opening 4122 and the display surface is relatively small, the sidewall of the second sub-opening 4122 has a relatively small slope, part of light emitted from the light-emitting element 25 at a large viewing angle cannot reach the sidewall of the second sub-opening 4122 and is emitted out of the display panel 10 without being totally reflected, further weakening the convergence of the light emitted from the light-emitting element 25 towards the display surface side, ensuring the brightness of at least part of the display panel 10 in the curved display region 12 at a large viewing angle, and alleviating the problem of insufficient brightness of the display panel 10 in the curved display region 12 on the light extraction side.

It is to be understood that when the first angle θ1 is greater than the second angle θ2, d1 is less than or equal to d2 so that at the same height distance from the display surface of the display panel, the first brightness of at least part of the display panel can be greater than the second brightness, alleviating the problems of the color cast and the darker color in the curved display region 12.

Figure 26:
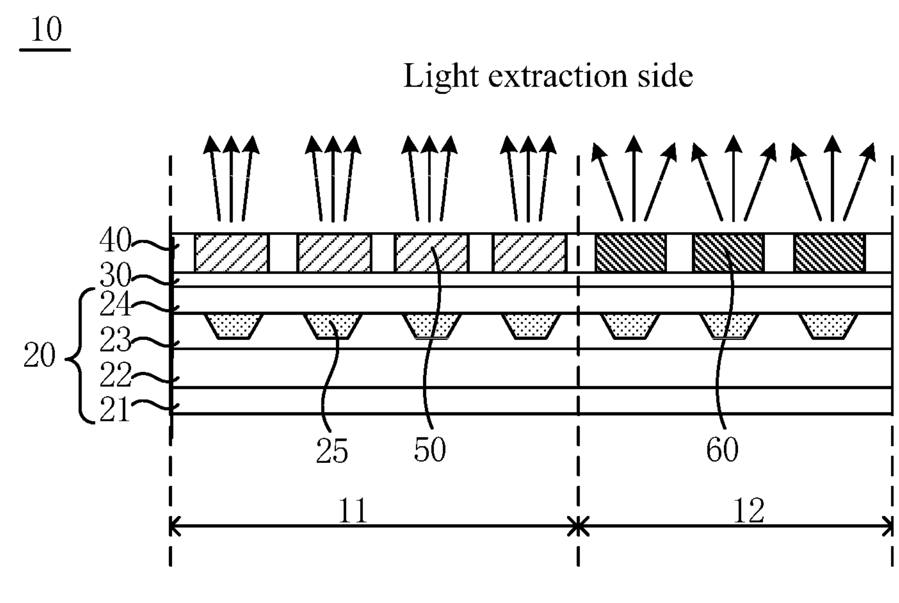
FIG. 26 is a structure diagram of another display panel prior to bending according to an embodiment of the present disclosure.

In an exemplary embodiment, to differentiate the optical function layer 40, in addition to the manner of making the light convergence capability of part of the optical function layer 40 different, the optical function layer may be provided with light diffusion regions so that part of the optical function layer 40 has a different light diffusion capability. FIG. 26 is a structure diagram of another display panel prior to bending according to an embodiment of the present disclosure. Referring to FIG. 26, the optical function layer 40 further includes multiple light diffusion regions 60; where the multiple light diffusion regions 60 are disposed in the curved display region 12, and the multiple light diffusion regions 60 correspond to at least part of the light-emitting elements 25 in the curved display region 12.

In an example, the light emitted from the light-emitting element 25 in the curved display region 12 is diffused towards the display surface side of the display panel 10 after passing through the light diffusion region 60 of the optical function layer 40 so that the second brightness of the display panel 10 is relatively small, and the brightness of the display panel 10 in a unit area of the curved display region 12 at a large viewing angle relatively high, thereby increasing the brightness of the display panel 10 in a unit area of the curved display region 12 on the light extraction side, helping to alleviate the problem of the darker color in the curved display region 12, and facilitating the low power consumption of the display panel 10.

Figure 27:
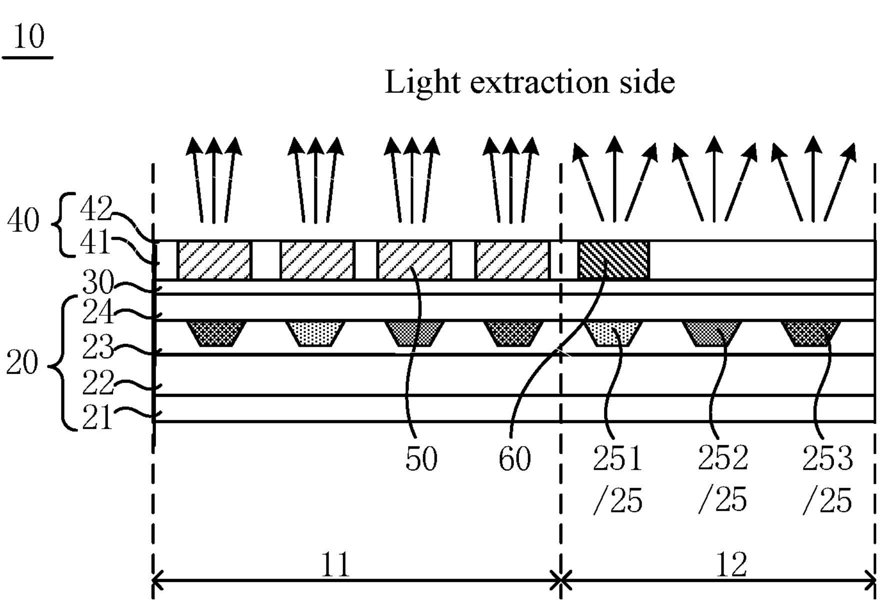
FIG. 27 is a structure diagram of another display panel prior to bending according to an embodiment of the present disclosure.

In an exemplary embodiment, FIG. 27 is a structure diagram of another display panel prior to bending according to an embodiment of the present disclosure. Referring to FIG. 27, in the direction perpendicular to the display surface of the display panel 10, the blue light-emitting element 251 in the curved display region 12 overlaps the light diffusion region 60, and the green light-emitting element 252 and the red light-emitting element 253 in the curved display region 12 each overlap no light diffusion region 60.

In an example, after the light emitted from the blue light-emitting element 251 in the curved display region 12 passes through the light diffusion region 60, the light diffusion region 60 may diffuse the light emitted from the blue light-emitting element 251 towards the display surface side of the display panel 10 and increase brightness of blue light of the display panel 10 in a unit area of the curved display region 12 at a large viewing angle. The green light-emitting element 252 and the red light-emitting element 253 have relatively poor light convergence, and brightness of green light and red light of the display panel 10 in a unit area of the curved display region 12 at a large viewing angle is relatively large. The light diffusion region 60 is disposed on a side of the blue light-emitting element 251 in the curved display region 12 facing away from the base substrate 21 and may diffuse the light emitted from the blue light-emitting element 251 so that at the same height distance and the same large viewing angle, the blue light, the green light, and the red light of the display panel 10 in a unit area tend to have consistent brightness. In this manner, the problem of the color cast in the curved display region 12 due to the fact that the blue light-emitting element 251, the green light-emitting element 252, and the red light-emitting element 253 decay differently in brightness as the viewing angle increases can be alleviated.

Figure 28:
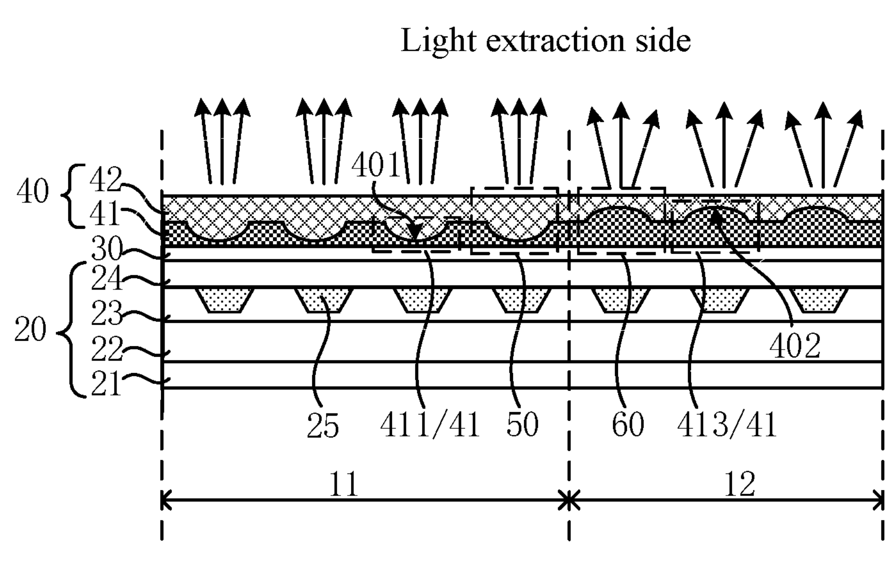
FIG. 28 is a structure diagram of another display panel prior to bending according to an embodiment of the present disclosure.

In an exemplary embodiment, the light diffusion capability of the light diffusion region 60 may also be implemented by a microstructure of the optical function layer 40. FIG. 28 is a structure diagram of another display panel prior to bending according to an embodiment of the present disclosure. Referring to FIG. 28, the first optical function layer 41 includes multiple second microlenses 413; where the multiple second microlenses 413 are disposed in the multiple light diffusion regions 60; in the direction perpendicular to the display surface of the display panel 10, the multiple second microlenses 413 overlap at least part of the light-emitting elements 25 in the curved display region 12; and a surface of each second microlens 413 in contact with the second optical function layer 42 is a second surface 402, the second surface 402 is curved, and the second surface 402 is convex towards the second optical function layer 42.

Figure 29:
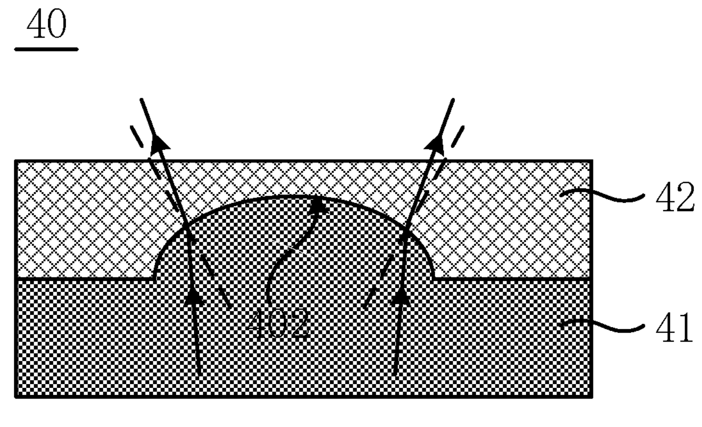
FIG. 29 is a schematic diagram of another light path in an optical function layer according to an embodiment of the present disclosure.

For example, FIG. 29 is a schematic diagram of another light path in an optical function layer according to an embodiment of the present disclosure. Referring to FIGS. 28 and 29, the second surface 402 is convex towards the second optical function layer 42 so that the second microlens 413 of the first optical function layer 41 is a convex lens, and the second optical function layer 42 includes a concave lens corresponding to the second microlens 413. When the light emitted from the light-emitting element 25 in the curved display region 12 is emitted from the first optical function layer 41 with a relatively small refractive index to the second optical function layer 42 with a relatively large refractive index and the concave lens, the light is diffused towards the display surface side of the display panel 10, and the second brightness of the display panel 10 is relatively small so that at the same height distance from the display surface of the display panel, the first brightness of at least part of the display panel 10 is greater than the second brightness, thereby alleviating the problems of the darker color and the color cast in the curved display region 12.

Figure 30:
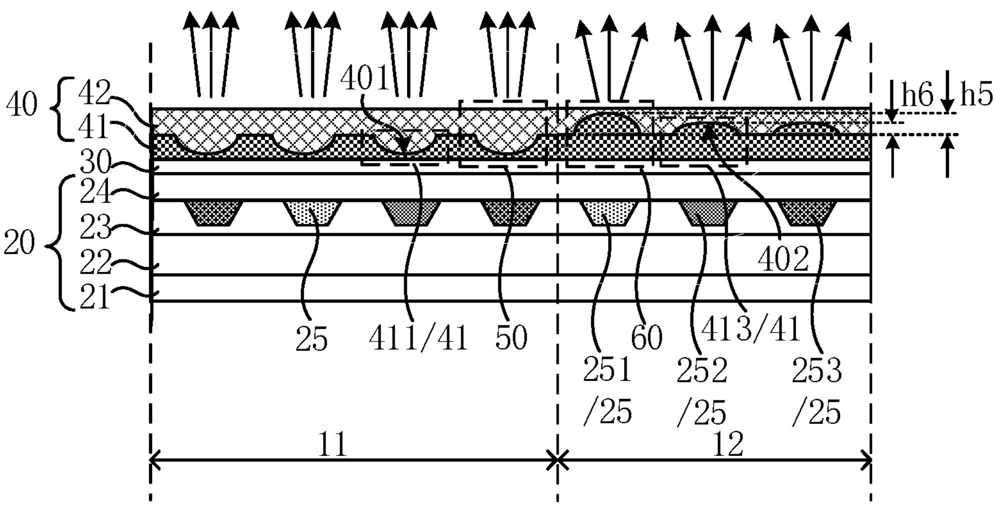
FIG. 30 is a structure diagram of another display panel prior to bending according to an embodiment of the present disclosure.

In an exemplary embodiment, FIG. 30 is a structure diagram of another display panel prior to bending according to an embodiment of the present disclosure. Referring to FIG. 30, in the direction perpendicular to the display surface of the display panel 10, a protrusion height of the second surface 402 overlapping the blue light-emitting element 251 in the curved display region 12 is a third height h5, and a protrusion height of the second surface 402 overlapping the green light-emitting element 252 or the red light-emitting element 253 in the curved display region 12 is a fourth height h6, where the third height h5 is greater than the fourth height h6.

In an example, the second surface 402 overlapping the blue light-emitting element 251 in the curved display region 12 in the direction perpendicular to the display surface of the display panel 10 has a relatively large curvature. When the light emitted from the blue light-emitting element 251 is refracted on the second surface 402, the light is diffused relatively strongly towards the display surface side. The second surface 402 overlapping the green light-emitting element 252 or the red light-emitting element 25 in the curved display region 12 in the direction perpendicular to the display surface of the display panel 10 has a relatively small curvature. When the light emitted from the green light-emitting element 252 or the red light-emitting element 253 is refracted on the second surface 402, the light is diffused relatively weakly towards the display surface side. In this manner, at the same height distance and the same large viewing angle, the blue light, the green light, and the red light of the display panel 10 in a unit area tend to have consistent brightness on the light extraction side, and the blue light, the green light, and the red light of the display panel 10 in the curved display region 12 can have uniform brightness on the light extraction side, thereby alleviating the problem of the color cast in the curved display region 12 due to the fact that the blue light-emitting element 251, the green light-emitting element 252, and the red light-emitting element 253 decay differently in brightness as the viewing angle increases.

Figure 31:
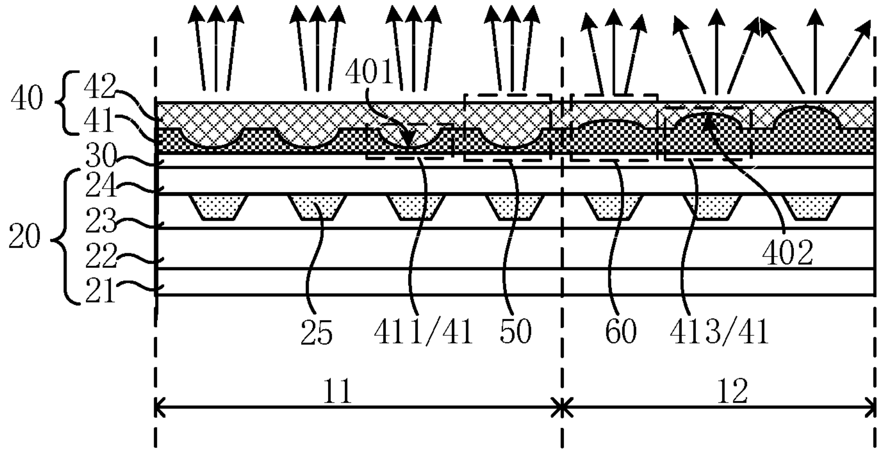
FIG. 31 is a structure diagram of another display panel prior to bending according to an embodiment of the present disclosure.

In an exemplary embodiment, FIG. 31 is a structure diagram of another display panel prior to bending according to an embodiment of the present disclosure. Referring to FIG. 31, in the curved display region 12, a protrusion height of the second surface 402 closer to the flat display region 11 is less than a protrusion height of the second surface 402 farther from the flat display region 11.

In an example, as the distance between the second surface 402 and the flat display region 11 increases, the curvature of the second surface 402 gradually increases, and the diffusion of directions of normals towards the light extraction side gradually increases. For light in the same direction, as the distance from the flat display region 11 increases, the diffusion of the light towards the light extraction side gradually increases, and the second brightness of the display panel 10 is increasingly small. Therefore, at the same height distance from the display surface of the display panel 10, the second brightness of the display panel 10 closer to the flat display region 11 is greater than the second brightness of the display panel 10 farther from the flat display region 11, the display panel 10 in the curved display region 12 can have uniform brightness on the light extraction side, and the problem of display non-uniformity due to different viewing angles at which the display panel 10 at different positions of the curved display region 12 emits light to the light extraction side can be alleviated.

Figure 32:
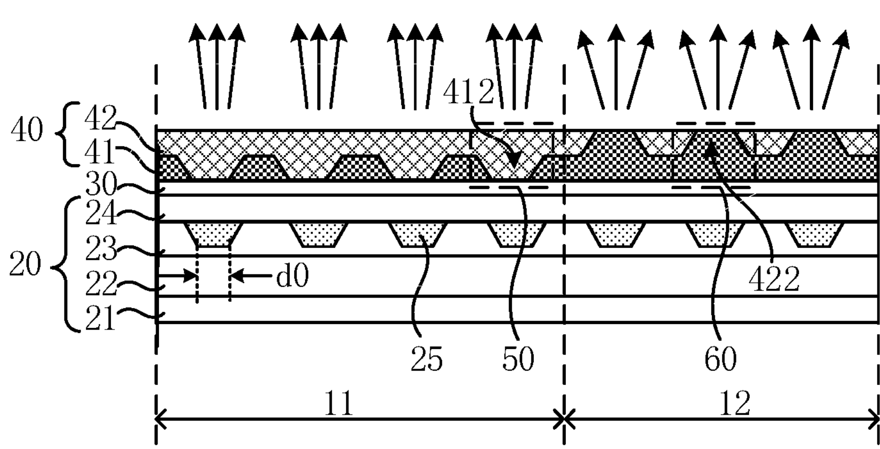
FIG. 32 is a structure diagram of another display panel prior to bending according to an embodiment of the present disclosure.

In an exemplary embodiment, FIG. 32 is a structure diagram of another display panel prior to bending according to an embodiment of the present disclosure. Referring to FIG. 32, the second optical function layer 42 includes multiple second openings 422; where the multiple second openings 422 are disposed in the multiple light diffusion regions 60; in the direction perpendicular to the display surface of the display panel 10, the multiple second openings 422 overlap at least part of the light-emitting elements 25 in the curved display region 12; and a side of a second opening 422 facing the light-emitting elements 25 has a greater dimension than a side of the second opening 422 facing away from the light-emitting elements 25.

Figure 33:
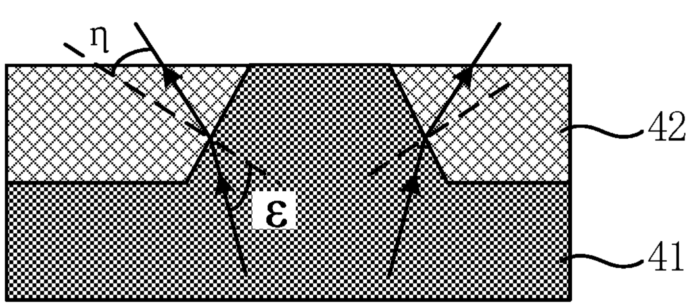
FIG. 33 is a schematic diagram of another light path in an optical function layer according to an embodiment of the present disclosure.

For example, the light diffusion region 60 includes the second optical function layer 42 forming the second opening 422 and the first optical function layer 41 filled in the second opening 422. The path of the light emitted from the light-emitting element 25 is changed at the contact surface between the first optical function layer 41 and the second optical function layer 42 so that the light emitted from the light-emitting element 25 is diffused towards the display surface side of the display panel 10, as shown in FIG. 33. Part of light emitted from at least part of the light-emitting elements 25 in the curved display region 12 is emitted to a sidewall of the second opening 422 and from the first optical function layer 41 with a relatively small refractive index to the second optical function layer 42 with a relatively large refractive index. The angle E of incidence is greater than the refraction angle $\eta$ and the light is diffused towards the display surface side of the display panel 10, thereby reducing the second brightness of the display panel 10, increasing the brightness of the display panel 10 in a unit area of the curved display region 12 at a large viewing angle, and effectively alleviating the problem of the darker color in the curved display region 12.

Figure 34:
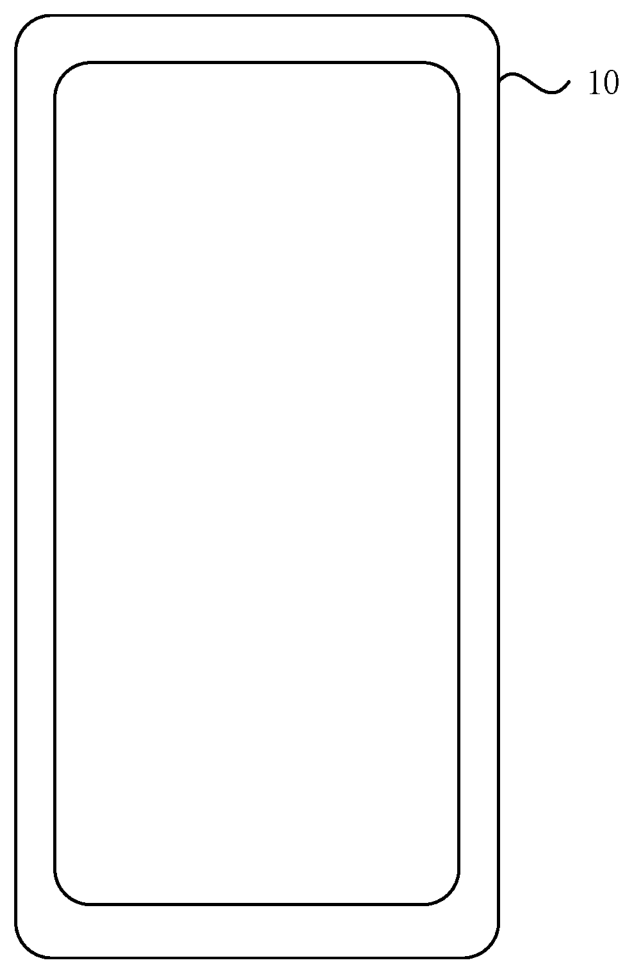
FIG. 34 is a structure diagram of a display device according to an embodiment of the present disclosure.

Based on the same inventive concept, embodiments of the present disclosure further provide a display device. FIG. 34 is a structure diagram of a display device according to an embodiment of the present disclosure. Referring to FIG. 34, a display device 70 includes the display panel 10 according to any embodiment of the present disclosure. The display device 70 of the embodiment of the present disclosure may be the cellphone shown in FIG. 34 or may be any other electronic product having a display function. The electronic product includes, but is not limited to, a television set, a laptop, a desktop display, a tablet, a digital camera, a smart bracelet, smart glasses, an in-vehicle display, a medical device, an industrial control device, or a touch interactive terminal. The electronic product is not specially limited in the embodiment of the present disclosure.

It is to be noted that the preceding are preferred embodiments of the present disclosure and the technical principles used therein. It is to be understood by those skilled in the art that the present disclosure is not limited to the embodiments described herein. For those skilled in the art, various apparent changes, readjustments, and substitutions can be made without departing from the scope of the present disclosure. Therefore, while the present disclosure has been described in detail through the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A display panel, comprising a flat display region and a curved display region;

wherein the display panel further comprises:

a display function layer comprising a base substrate and a plurality of light-emitting elements on a side of the base substrate; and an optical function layer on a side of the plurality of light-emitting elements facing away from the base substrate; wherein at least part of the optical function layer is disposed in the flat display region;

wherein brightness of the display panel in a unit area of the flat display region at a viewing angle of 0° is first brightness; and brightness of the display panel in a unit area of the curved display region at a viewing angle of 0° is second brightness; wherein the viewing angle of 0° is a viewing angle perpendicular to a display surface of the display panel; and at a same height distance from the display surface of the display panel, the first brightness of at least part of the display panel is greater than the second brightness;

wherein the optical function layer comprises a plurality of light convergence regions;

at least part of the plurality of light convergence regions are disposed in the flat display region, and the at least part of the plurality of light convergence regions correspond to at least light-emitting elements in the flat display region;

light emitted from a light-emitting element of the light-emitting elements is converged towards a display surface side of the display panel after passing through a respective light convergence region of the optical function layer; and the optical function layer in the curved display region has a thickness of 0 or greater than 0 μm.

2. The display panel according to claim 1, wherein the plurality of light convergence regions comprise first light convergence regions in the flat display region and second light convergence regions in the curved display region;

at least part of the first light convergence regions correspond to at least part of the light-emitting elements in the flat display region, and the second light convergence regions correspond to at least part of light-emitting elements in the curved display region; and a first light convergence region of the first light convergence regions has a greater light convergence capability than a second light convergence region of the second light convergence regions.

3. The display panel according to claim 2, wherein the light-emitting elements comprise a blue light-emitting element, a green light-emitting element, and a red light-emitting element; and in a direction perpendicular to the display surface of the display panel, the blue light-emitting element in the curved display region overlaps no light convergence region, and the green light-emitting element and the red light-emitting element in the curved display region each overlap the second light convergence region.

4. The display panel according to claim 2, wherein at the same height distance from the display surface of the display panel, second brightness of at least part of the display panel closer to the flat display region is greater than second brightness of the display panel farther from the flat display region.

5. The display panel according to claim 1, wherein the optical function layer comprises a first optical function layer on the side of the plurality of light-emitting elements facing away from the base substrate and a second optical function layer on a side of the first optical function layer facing away from the plurality of light-emitting elements;

wherein the second optical function layer has a greater refractive index than the first optical function layer.

6. The display panel according to claim 5, wherein the optical function layer in the curved display region has a thickness d within a value range of 26 μm≤d≤31 μm; and at least one of the first optical function layer or the second optical function layer is disposed in the curved display region.

7. The display panel according to claim 5, wherein the first optical function layer comprises a plurality of first microlenses; wherein the plurality of first microlenses are disposed in the plurality of light convergence regions; and in a direction perpendicular to the display surface of the display panel, the plurality of first microlenses overlap at least the light-emitting elements in the flat display region; and a surface of a first microlens of the plurality of first microlenses in contact with the second optical function layer is a first surface, the first surface is curved, and the first surface is convex towards the first optical function layer.

8. The display panel according to claim 7, wherein a protrusion height of the first surface in the curved display region is less than or equal to a protrusion height of the first surface in the flat display region.

9. The display panel according to claim 8, wherein in the curved display region, a protrusion height of the first surface closer to the flat display region is greater than a protrusion height of the first surface farther from the flat display region.

10. The display panel according to claim 5, wherein the first optical function layer comprises a plurality of first openings; wherein the plurality of first openings are disposed in the plurality of light convergence regions;

in a direction perpendicular to the display surface of the display panel, the plurality of first openings overlap at least the light-emitting elements in the flat display region; and a side of a first opening of the plurality of first openings facing the light-emitting elements has a smaller dimension than a side of the first opening facing away from the light-emitting elements.

11. The display panel according to claim 10, wherein the plurality of first openings comprise first sub-openings in the flat display region and second sub-openings in the curved display region;

in the direction perpendicular to the display surface of the display panel, at least part of the first sub-openings overlap at least part of the light-emitting elements in the flat display region, and the second sub-openings overlap at least part of light-emitting elements in the curved display region; and in a direction parallel to the display surface of the display panel, each of the first sub-openings has a minimum dimension d1, and each of the second sub-openings has a minimum dimension d2, wherein d1<d2, and 0.1 μm≤d2−d1≤2 μm.

12. The display panel according to claim 10, wherein the plurality of first openings comprise first sub-openings in the flat display region and second sub-openings in the curved display region;

in the direction perpendicular to the display surface of the display panel, at least part of the first sub-openings overlap at least part of the light-emitting elements in the flat display region, and the second sub-openings correspond to at least part of light-emitting elements in the curved display region; and an angle between a sidewall of a first sub-opening of the first sub-openings and the display surface is a first angle; an angle between a sidewall of a second sub-opening of the second sub-openings and the display surface is a second angle; and the first angle and the second angle are less than 90°, and the first angle is greater than the second angle.

13. The display panel according to claim 5, wherein the optical function layer further comprises a plurality of light diffusion regions;

the plurality of light diffusion regions are disposed in the curved display region, and the plurality of light diffusion regions correspond to at least part of light-emitting elements in the curved display region; and light emitted from a light-emitting element of the light-emitting elements is diffused towards the display surface side of the display panel after passing through a respective light diffusion region of the optical function layer.

14. The display panel according to claim 13, wherein the light-emitting elements comprise a blue light-emitting element, a green light-emitting element, and a red light-emitting element; and in a direction perpendicular to the display surface of the display panel, the blue light-emitting element in the curved display region overlaps the light diffusion region, and the green light-emitting element and the red light-emitting element in the curved display region each overlap no light diffusion region.

15. The display panel according to claim 13, wherein the first optical function layer comprises a plurality of second microlenses; wherein the plurality of second microlenses are disposed in the plurality of light diffusion regions; and in a direction perpendicular to the display surface of the display panel, the plurality of second microlenses overlap at least part of the light-emitting elements in the curved display region; and a surface of a second microlens of the plurality of second microlenses in contact with the second optical function layer is a second surface, the second surface is curved, and the second surface is convex towards the second optical function layer.

16. The display panel according to claim 15, wherein the light-emitting elements comprise a blue light-emitting element, a green light-emitting element, and a red light-emitting element; and in the direction perpendicular to the display surface of the display panel, a protrusion height of the second surface overlapping the blue light-emitting element in the curved display region is a third height, and a protrusion height of the second surface overlapping the green light-emitting element or the red light-emitting element in the curved display region is a fourth height, wherein the third height is greater than the fourth height.

17. The display panel according to claim 15, wherein in the curved display region, a protrusion height of the second surface closer to the flat display region is less than a protrusion height of the second surface farther from the flat display region.

18. The display panel according to claim 13, wherein the second optical function layer comprises a plurality of second openings; wherein the plurality of second openings are disposed in the plurality of light diffusion regions;

in a direction perpendicular to the display surface of the display panel, the plurality of second openings overlap at least part of the light-emitting elements in the curved display region; and a side of a second opening of the plurality of second openings facing the light-emitting elements has a greater dimension than a side of the second opening facing away from the light-emitting elements.

19. A display device, comprising a display panel, wherein the display panel comprises a flat display region and a curved display region;

wherein the display panel further comprises:

a display function layer comprising a base substrate and a plurality of light-emitting elements on a side of the base substrate; and an optical function layer on a side of the plurality of light-emitting elements facing away from the base substrate; wherein at least part of the optical function layer is disposed in the flat display region;

wherein brightness of the display panel in a unit area of the flat display region at a viewing angle of 0° is first brightness; and brightness of the display panel in a unit area of the curved display region at a viewing angle of 0° is second brightness; wherein the viewing angle of 0° is a viewing angle perpendicular to a display surface of the display panel; and at a same height distance from the display surface of the display panel, the first brightness of at least part of the display panel is greater than the second brightness;

wherein the optical function layer comprises a plurality of light convergence regions;

at least part of the plurality of light convergence regions are disposed in the flat display region, and the at least part of the plurality of light convergence regions correspond to at least light-emitting elements in the flat display region;

light emitted from a light-emitting element of the light-emitting elements is converged towards a display surface side of the display panel after passing through a respective light convergence region of the optical function layer; and the optical function layer in the curved display region has a thickness of 0 or greater than 0 μm.

20. The display device according to claim 19, wherein the plurality of light convergence regions comprise first light convergence regions in the flat display region and second light convergence regions in the curved display region;

at least part of the first light convergence regions correspond to at least part of the light-emitting elements in the flat display region, and the second light convergence regions correspond to at least part of light-emitting elements in the curved display region; and a first light convergence region of the first light convergence regions has a greater light convergence capability than a second light convergence region of the second light convergence regions.

* * * * *